United States Patent
Kawabata et al.

(10) Patent No.: US 7,911,874 B2
(45) Date of Patent: Mar. 22, 2011

(54) SEMICONDUCTOR INTEGRATED CIRCUIT

(75) Inventors: Kuninori Kawabata, Kawasaki (JP); Yoshiyuki Ishida, Kasugai (JP); Satoshi Eto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 405 days.

(21) Appl. No.: 12/129,433

(22) Filed: May 29, 2008

(65) Prior Publication Data

US 2008/0298159 A1    Dec. 4, 2008

(30) Foreign Application Priority Data

May 30, 2007    (JP) .................................. 2007-142957

(51) Int. Cl.
*G11C 8/18* (2006.01)
(52) U.S. Cl. .................................. 365/233.5; 365/189.17
(58) Field of Classification Search ............... 365/233.5, 365/189.17
See application file for complete search history.

(56) References Cited

U.S. PATENT DOCUMENTS

| 7,058,863 B2 | 6/2006 | Kouchi et al. |
| 2003/0009612 A1 | 1/2003 | Latta |
| 2003/0182513 A1 | 9/2003 | Dodd |
| 2005/0144372 A1 | 6/2005 | Walker |
| 2005/0182868 A1 | 8/2005 | Kang |
| 2008/0316788 A1* | 12/2008 | Kashiwa .................. 365/51 |
| 2010/0001758 A1* | 1/2010 | Dreps et al. .................. 326/30 |
| 2010/0091536 A1* | 4/2010 | Kim .................. 365/51 |

FOREIGN PATENT DOCUMENTS

| JP | 4-147663 A | 5/1992 |
| JP | 8-204161 A | 8/1996 |
| JP | 2002-324395 A | 11/2002 |
| WO | WO 03/079662 A2 | 9/2003 |
| WO | WO 03/079662 A3 | 9/2003 |

* cited by examiner

*Primary Examiner* — Tuan T. Nguyen
(74) *Attorney, Agent, or Firm* — Fujitsu Patent Center

(57) ABSTRACT

An interface conversion macro converts a signal compliant with a system interface specification output from a controller to a signal compliant with a memory interface specification, and outputs the same to a memory interface part, and it also converts a signal output from the memory macro to a signal compliant with the system interface specification and outputs the same to the controller. By converting the system interface specification and the memory interface specification to each other by an interface conversion macro, a common memory macro can be mounted on a semiconductor integrated circuit even when the system interface specification differs. Accordingly, when designing a system, the design verification time, evaluation time, and test time of the semiconductor integrated circuit can be reduced. As a result, the design time and design cost of the semiconductor integrated circuit can be reduced.

18 Claims, 20 Drawing Sheets

| MODE | CMD | | | MCMD | | |
|---|---|---|---|---|---|---|
| | /CE | /OE | /WE | /MCE | /MWE | /MREF |
| STBY | H | H | H | H | H | H |
| RD | L | L | H | L | H | H |
| WR | L | H | L | L | L | H |
| REF | H | L | H | L | H | L |

Fig. 3

SEMICONDUCTOR INTEGRATED CIRCUIT

CROSS-REFERENCE TO RELATED APPLICATION

This application is based upon and claims the benefit of priority from Japanese Patent Application No. 2007-142957, filed on May 30, 2007, the entire contents of which are incorporated herein by reference.

BACKGROUND

1. Field

The present embodiments relate to semiconductor integrated circuits with a memory macro and an interface conversion macro for accessing this memory macro.

2. Description of the Related Art

The performances of system products, such as a mobile phone, have been improving every year. The data size handled by a system has become large and the data transfer rate has been increasing. Associated with this, semiconductor integrated circuits, such as an SoC (System on Chip), which integrate a memory macro and a controller for accessing this memory macro into one chip, have received attention. In an SoC, since the data bus width can be made wider, the data transfer rate can be improved without increasing a clock frequency. Japanese Laid-open Patent Publication No. 8-204161 and Japanese Laid-open Patent Publication No. 8-204161 and Japanese Laid-open Patent Publication No. 4-147663 disclose this technology.

SUMMARY

According to one aspect of an embodiment, a semiconductor integrated is provided which comprises a memory macro including a memory cell array and a memory interface portion that inputs and outputs a signal compliant with a memory interface specification, and an interface conversion macro which converts a signal compliant with a system interface specification output from a controller to a signal compliant with the memory interface specification and outputs to the memory interface portion, and which converts a signal output from the memory interface portion to a signal compliant with the system interface specification and outputs to the controller.

BRIEF DESCRIPTION OF THE DRAWINGS

FIG. 3 illustrates an explanatory view showing a relationship between a command signal output from a controller and a memory command signal supplied to a memory macro.

DETAILED DESCRIPTION OF THE EMBODIMENTS

Figure 1:
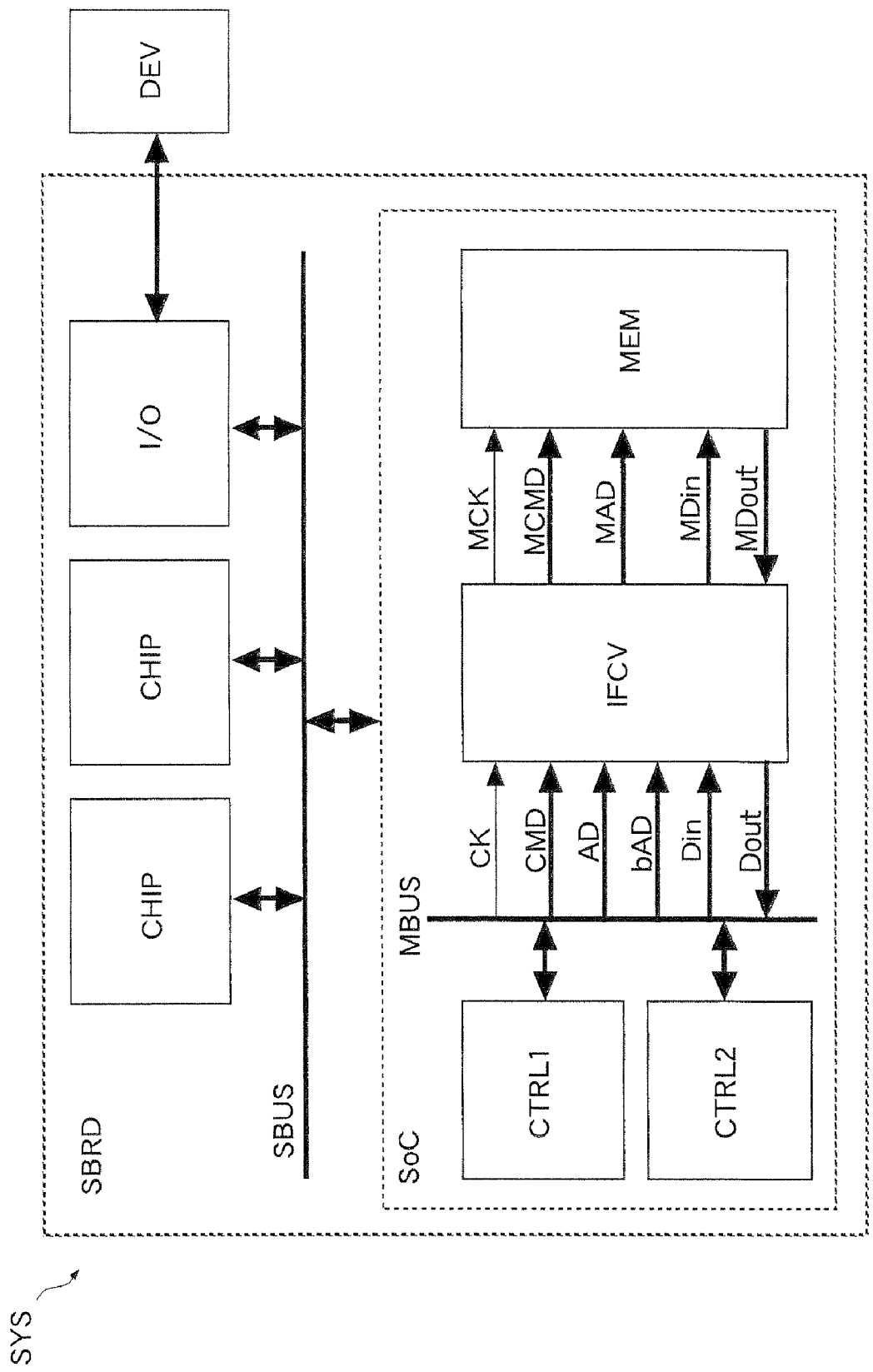
FIG. 1 illustrates a block diagram showing a first embodiment.

Hereinafter, embodiments will be described, using the drawings. In the drawings, each signal line shown by the heavy line is constituted of a plurality of lines. Part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal. Each double square in the drawings represents a terminal for a macro (macro terminal). Since a wire, a bump, or the like is not coupled to the macro terminal, the macro terminal is formed as a wiring pattern on a semiconductor chip.

FIG. 1 illustrates a first embodiment. A semiconductor integrated circuit of this embodiment is formed as an SoC, in which controller macros CTRL1, CTRL2, an interface conversion macro IFCV, and a memory macro MEM (hereinafter, also referred to as a memory MEM) are mounted. The controller macros CTRL1, CTRL2 and the interface conversion macro IFCV are coupled to each other via a memory bus MBUS. The SoC is mounted on a system board SBRD along with a plurality of semiconductor chips CHIPs and an external interface unit I/O. The SoC, the semiconductor chips CHIPs, and the external interface unit I/O are coupled to each other via a system bus SBUS. Then, a system SYS includes the system board SBRD, and a peripheral device DEV coupled to the external interface unit I/O.

The system SYS is a portable equipment, such as a mobile phone, for example. The semiconductor chips CHIPs are, for example, a CPU, a communication LSI, and the like. The peripheral device DEV is, for example, a liquid crystal display, a speaker, an input device, or the like. In addition, on the system board SBRD, there is mounted a non-illustrated non-volatile semiconductor memory, such as a flash memory, for storing programs executed by the CPU. For example, the memory macro MEM is a DRAM core (IP) and designed as a hard macro cell containing a mask data. By designing, as a hard macro cell, the memory macro MEM that is independent of system specifications and can be used in common, the size of the memory macro MEM can be minimized and the chip cost of an SoC can be reduced.

The interface conversion macro IFCV is designed as a soft macro. Accordingly, the interface conversion macro IFCV can be designed in such shapes that conform to free spaces of newly designed various SoCs, and the location of terminals also can be designed in accordance with circuits laid out around the interface conversion macro IFCV. Accordingly, the design efficiency of an SoC can be improved and the design time and design cost of the SoC can be reduced.

The controller CTRL1 is, for example, an MPEG core (IP) that processes image data held in the memory MEM. The controller CTRL2 is a DMAC core (IP), for example. The interface conversion macro IFCV is, for example, manufactured along with at least either of the controllers CTRL1-2 by coupling between terminals of logic elements that are formed in an array configuration in advance. Namely, the interface conversion macro IFCV is designed as a gate array or a programmable logic device. Then, the design verification and test of the interface conversion macro IFCV are carried out along with the controller CTRL1 or CTRL2.

The memory bus MBUS includes signal lines of a clock signal CK, command signal CMD, address signal AD, burst address signal bAD, data input signal Din, and data output signal Dout for accessing the memory MEM. These signals may be output from the controllers CTRL1-2, or may be output from a memory controller (not shown). Furthermore, the interface conversion macro IFCV may be provided in the memory controller. In this case, the memory bus MBUS outputs address information called transaction and a write data to the memory controller, and receives a read data from the memory controller, for example. The address information includes an access start address, read/write information, and a data size. The memory controller generates a command signal CMD, an address signal AD, and a burst address signal bAD based on the address information.

The interface conversion macro IFCV receives the signals CK, CMD, AD, bAD, and Din from the memory bus MBUS having a system interface specification specific to the system SYS, and converts the received signals to a memory clock signal MCK, memory command signal MCMD, memory address signal MAD, and memory data input signal MDin for accessing the memory MEM. Moreover, the interface conversion macro IFCV converts a data output signal MDout received from the memory MEM to a data output signal Dout compliant with a memory interface specification.

The interface conversion macro IFCV is designed for each system SYS in accordance with the memory interface specification of the system SYS. The memory interface specification includes, for example, at least either of a burst length BL and a read latency RL described later. The burst length BL is the number of times of a read data signal that is continuously output to the memory bus MBUS in response to a single read command, and is the number of times of a write data signal that is continuously supplied from the memory bus MBUS in response to a single write command. The read latency RL is the number of clocks after a read command is supplied until a read data is output.

According to the memory interface specification of this embodiment, the burst length BL=4 and the read latency RL=7. In other words, the controllers CTRL1-2 recognize that the memory MEM operates at the burst length BL=4 and the read latency RL=7. However, the actual memory MEM operates only at the burst length BL=1 and the read latency RL=3, for example. The interface conversion macro IFCV converts the interface specifications to each other.

In this embodiment, as described above, the memory MEM is accessed by a signal of one memory interface specification independently of the interface specification of the system SYS, and performs a read operation, a write operation, and a refresh operation. Specifically, the memory MEM operates only at the burst length BL=1 and the read latency RL=3, as described above. This allows the memory MEM to be configured as a common hard macro cell independently of the system interface specification. The design verification, characteristic evaluation, and test pattern design of the memory MEM may be carried out only once. In other words, in developing a new system SYS (SoC), only design verification, characteristic evaluation, and test pattern design of the interface conversion macro IFCV may be carried out. As a result, at the time of the development of the system SYS, the design time of SoC can be reduced and the design cost can be reduced.

In addition, in this embodiment, as shown in second, third, fourth, and fifth embodiments described later, even in the case where the controller CTRL1 or CTRL2 outputs signals compliant with various system interface specifications, redesign of only the interface conversion macro IFCV allows a common memory macro MEM to be used.

Figure 2:
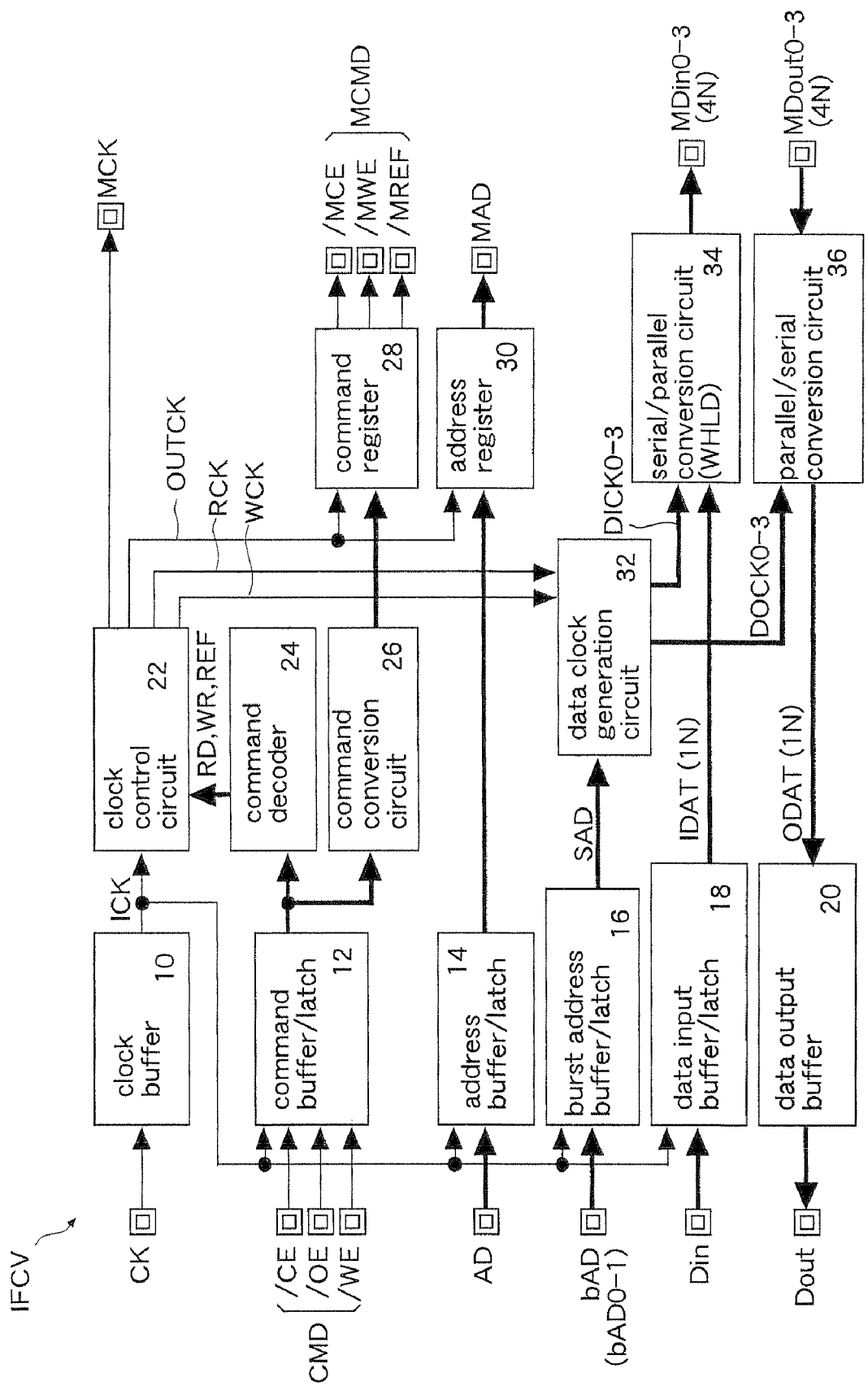
FIG. 2 illustrates a block diagram showing an interface conversion macro shown in FIG. 1.

FIG. 2 illustrates the interface conversion macro IFCV shown in FIG. 1. The interface conversion macro IFCV includes a clock buffer 10, a command buffer/latch 12, an address buffer/latch 14, a burst address buffer/latch 16, a data input buffer/latch 18, a data output buffer 20, a clock control circuit 22, a command decoder 24, a command conversion circuit 26, a command register 28, an address register 30, a data clock generation circuit 32, a serial/parallel conversion circuit 34, and a parallel/serial conversion circuit 36. The clock buffer 10, command buffer/latch 12, address buffer/latch 14, burst address buffer/latch 16, data input buffer/latch 18, and data output buffer 20 input or output signals compliant with the system interface specification. The clock control circuit 22, command register 28, address register 30, serial/parallel conversion circuit 34, and parallel/serial conversion circuit 36 input or output signals compliant with the memory interface specification.

The clock buffer 10 outputs the clock signal CK as an internal clock signal ICK. The command buffer/latch 12 latches the command signal CMD for accessing the memory MEM in synchronization with the internal clock signal ICK and outputs the latched signal. The command signal CMD includes a chip enable signal /CE, an output enable signal /OE, and a write enable signal /WE. The address buffer/latch 14 latches the address signal AD in synchronization with the internal clock signal ICK and outputs the latched signal. The burst address buffer/latch 16 latches a 2-bit burst address signal bAD (bAD0-1) in synchronization with the internal clock signal ICK and outputs the latched signal as a start address SAD.

The data input buffer/latch 18 latches and holds the data input signal Din (write data signal to the memory MEM) in synchronization with the internal clock signal ICK, and outputs the held signal as a data input signal IDAT. The data output buffer 20 receives a data output signal ODAT (read data from the memory MEM), and outputs the received signal as a data output signal Dout. The data input signal Din and the data output signal Dout are configured 32 bits, respectively, for example. In this embodiment, 32 bits correspond to a basic bit width. "N" of "1N" denoted in the data signal IDAT and ODAT indicates 32 bits.

Figure 4:
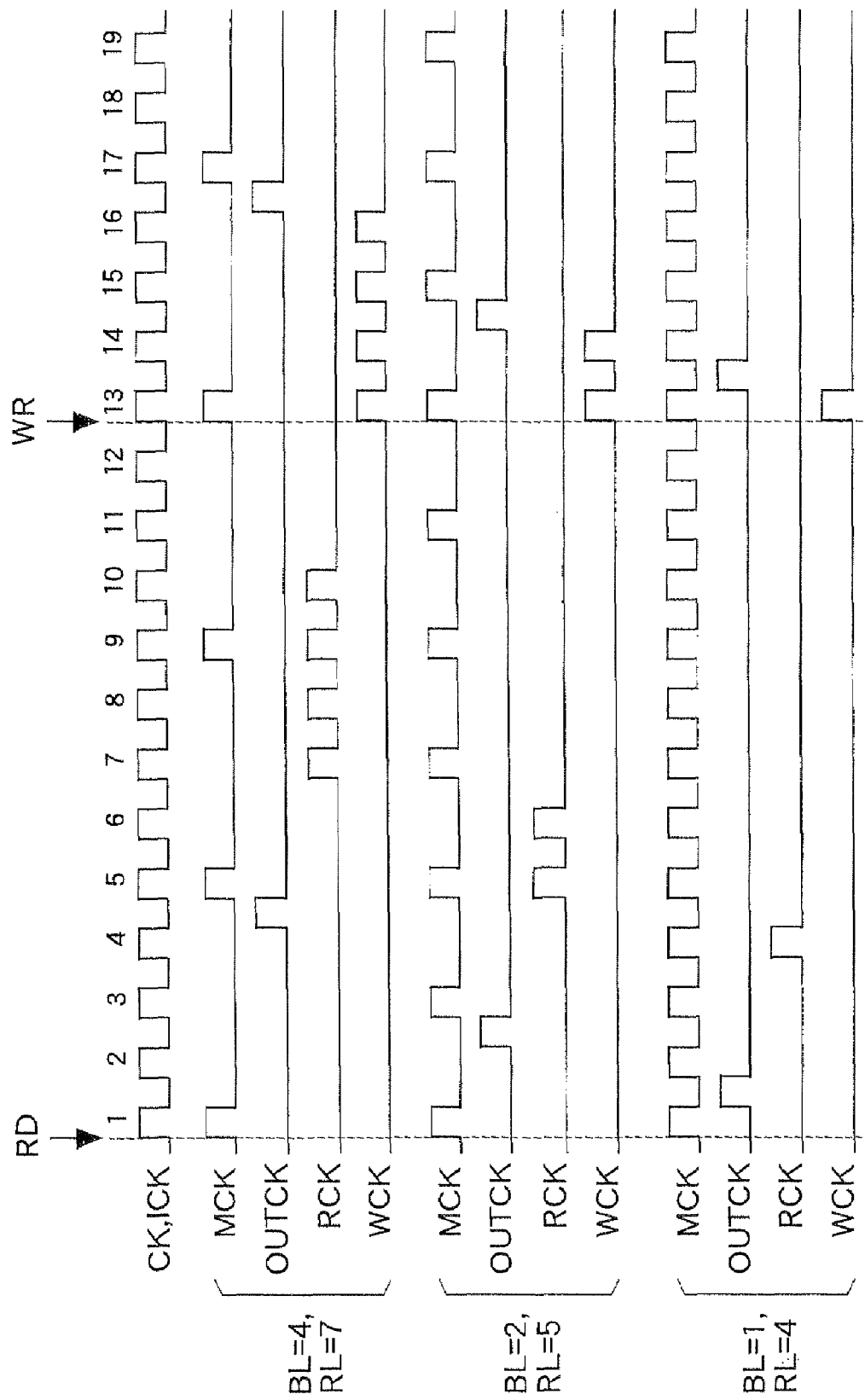
FIG. 4 illustrates a timing chart showing an operation of a clock control circuit shown in FIG. 2.

The clock control circuit 22 uses the internal clock signal ICK to generate the memory clock signal MCK, an output clock signal OUTCK, and a read clock signal RCK or a write clock signal WCK. Namely, the clock control circuit 22 generates the clock pulses OUTCK, RCK, and WCK compliant with the memory interface specification in response to a decoded result of the command decoder 24. The memory clock signal MCK is supplied to a clock terminal of the memory MEM. The output clock signal OUTCK is a signal for determining the operation timings of the command register 28 and address register 30. The read clock signal RCK is output during a read operation of the memory MEM. The write clock signal WCK is output during a write operation of the memory MEM. The detail of the operation of the clock control circuit 22 is illustrated in FIG. 4.

The command decoder 24 decodes the command signal CMD output from the controller CTRL1 or CTRL2. Specifically, the command decoder 24 outputs a read command signal RD when a command signal output from the command buffer/latch 12 indicates a read command, and outputs a write command signal WR when the command signal indicates a write command. The command conversion circuit 26 converts a command signal output from the command buffer/latch 12 to a command signal for accessing the memory MEM and outputs the same. Namely, the command conversion circuit 26 converts a command signal supplied via the memory bus MBUS to a command signal compliant with the interface specification of the memory MEM. The operation of the command conversion circuit 26 is illustrated in FIG. 3.

The command register 28 holds a command signal output from the command conversion circuit 26, and outputs the held command signal as the memory command signal MCMD in synchronization with the output clock signal OUTCK. The memory command signal MCMD includes a memory chip enable signal /MCE, a memory write enable signal /MWE, and a memory refresh signal /MREF. The address register 30 holds an address signal output from the address conversion circuit 28, and outputs the held address signal as the memory address signal MAD in synchronization with the output clock signal OUTCK.

Figure 5:
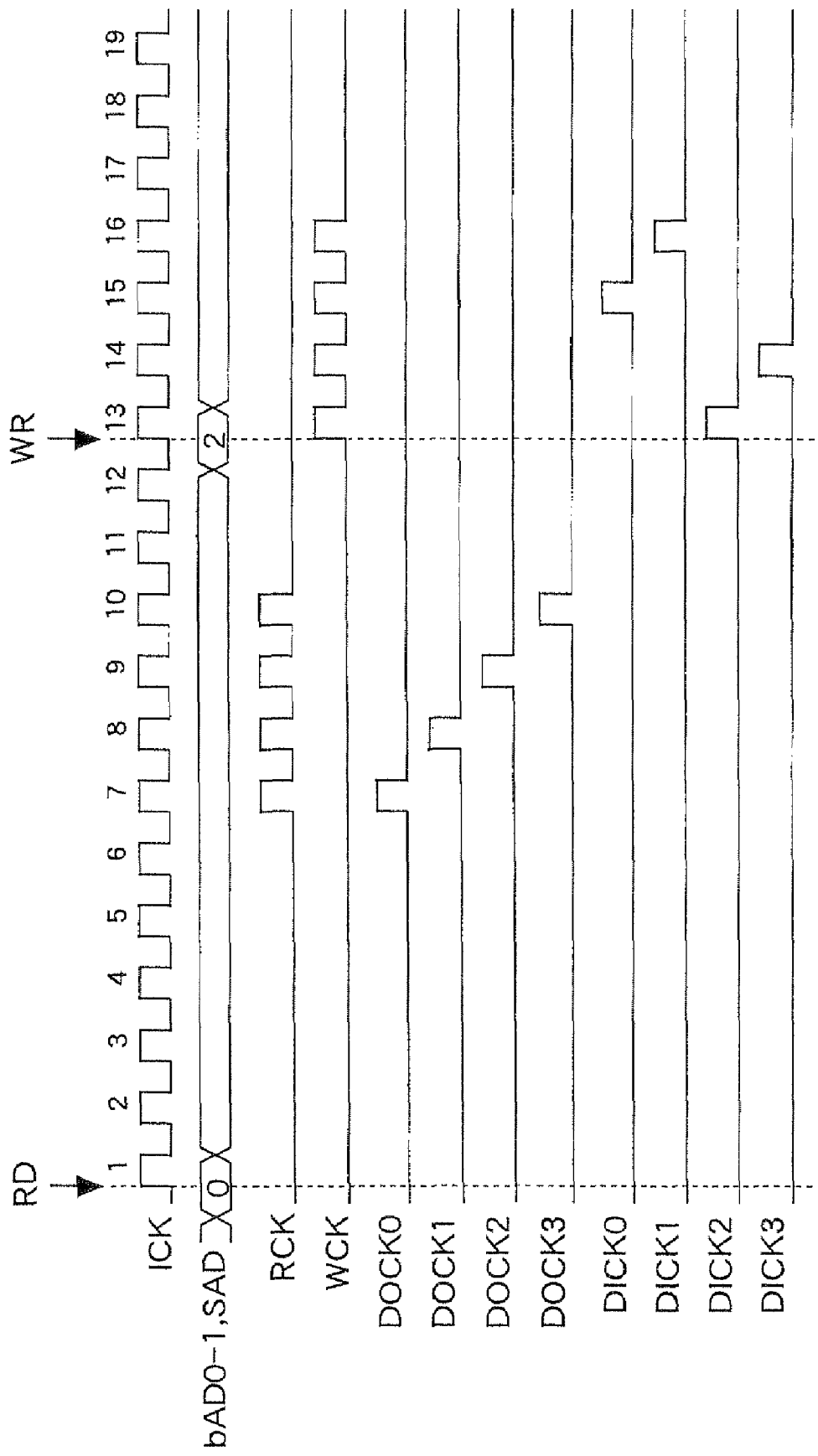
FIG. 5 illustrates a timing chart showing an operation of a data clock generation circuit shown in FIG. 2.

The data clock generation circuit 32 sequentially generates data output clock signals DOCK0-3 in synchronization with the read clock signal RCK, and sequentially generates data input clock signals DICK0-3 in synchronization with the write clock WCK. The order of generation of the data output clock signals DOCK0-3 and the order of generation of the data input clock signals DICK0-3 are set in response to the value of the start address SAD (i.e., burst address signal bAD0-1). The operation of the data clock generation circuit 32 is illustrated in FIG. 5.

The serial/parallel conversion circuit 34 includes a write data hold circuit WHLD. During the write operation, the write data hold circuit WHLD holds the serial data input signal IDAT in synchronization with the data input clock signals DICK0-3 (clock pulse), and outputs the held data input signal IDAT as parallel memory data input signals MDin0-3 after the data input clock signals DICK0-3 are output. Namely, the serial/parallel conversion circuit 34 operates as a write data conversion circuit that sequentially holds the write data signal IDAT held in the data input buffer/latch 18 in synchronization with the clock pulses DICK0-3, and outputs the held write data signal IDAT to the memory MEM. The write data hold circuit WHLD includes a number (128) of hold parts corresponding to the number of bits of the memory data input signals MDin0-3 in order to hold the write data signal IDAT that is supplied in response to the write command WR. Each hold part holds the data input signal IDAT in synchronization with either of the clock pulses DICK0-3. In addition, the number of bits (32 bits) of the data input signal IDAT (serial write data signal) is fewer than the number of the hold parts.

During the read operation, the parallel/serial conversion circuit 36 selects either of the memory data output signals MDout0-3 (parallel read data signal) in response to the data input clock signals DICK0-3 (clock pulses), and outputs the selected data signal as the data output signal ODAT (serial read data signal). Namely, the parallel/serial conversion circuit 36 operates as a read data conversion circuit that outputs the read data signals MDout0-3, which are output from the memory macro MEM, to the controller CTRL1 or CTRL2 in synchronization with the clock pulses DICK0-3.

FIG. 3 illustrates a relationship between the command signal CMD compliant with the system interface specification output from the controller CTRL1 or CTRL2 and the memory command signal MCMD compliant with the memory interface specification supplied to the memory macro MEM. In the view, a signal with a high logic level is denoted as "H" and a signal with a low logic level is denoted as "L". The memory MEM has four operation commands (operating states) STBY, RD, WR, and REF, for example. The standby command STBY is supplied when setting the memory MEM into a standby state (non access state). The read command RD is supplied when causing the memory MEM to execute the read operation. The write command WR is supplied when causing the memory MEM to execute the write operation. The refresh command REF is supplied when causing the memory MEM to execute the refresh operation. The interface conversion macro IFCV converts the command signal CMD compliant with the system interface specification to the memory command signal MCMD compliant with the memory interface specification.

The standby command STBY is recognized by high levels of all the command signals. The interface conversion macro IFCV recognizes the read command RD by the /CE signal of a low level, the /OE signal of a low level, and the /WE signal of a high level, and outputs the /MCE signal of a low level, the /MWE signal of a high level, and the /MREF signal of a high level to the memory MEM. The interface conversion macro IFCV recognizes the write command WR by the /CE signal of a low level, the /OE signal of a high level, and the /WE signal of a low level, and outputs the /MCE signal of a low level, the /MWE signal of a low level, and the /MREF signal of a high level to the memory MEM.

Furthermore, the interface conversion macro IFCV recognizes the refresh command REF by the /CE signal of a high level, the /OE signal of a low level, and the /WE signal of a high level, and outputs the /MCE signal of a low level, the /MWE signal of a high level, and the /MREF signal of a low level to the memory MEM. Thus, the interface conversion macro IFCV has the function to convert a command signal (system interface specification) on the memory bus MBUS to a command signal (memory interface specification) for operating the memory MEM.

FIG. 4 illustrates the operation of the clock control circuit 22 shown in FIG. 2. In this embodiment, the clock control circuit 22 corresponding to the burst length BL=4 and the read latency RL=7 is designed. Waveforms with BL=2 and RL=5 shown in the view illustrates the operation of a clock control circuit 22A of the second embodiment described later. Waveforms with BL=1 and RL=4 illustrates the operation of a clock control circuit 22B of the third embodiment described later. The logics of the clock control circuits 22, 22A, and 22B are designed in accordance with the memory interface specification, respectively. The number of pulses of the read clock signal RCK and the number of pulses of the write clock signal WCK are equal to the number corresponding to the burst length. Moreover, the first clock pulse of the read clock signal RCK is output after the number of clocks corresponding to the read latency RL.

Figure 7:
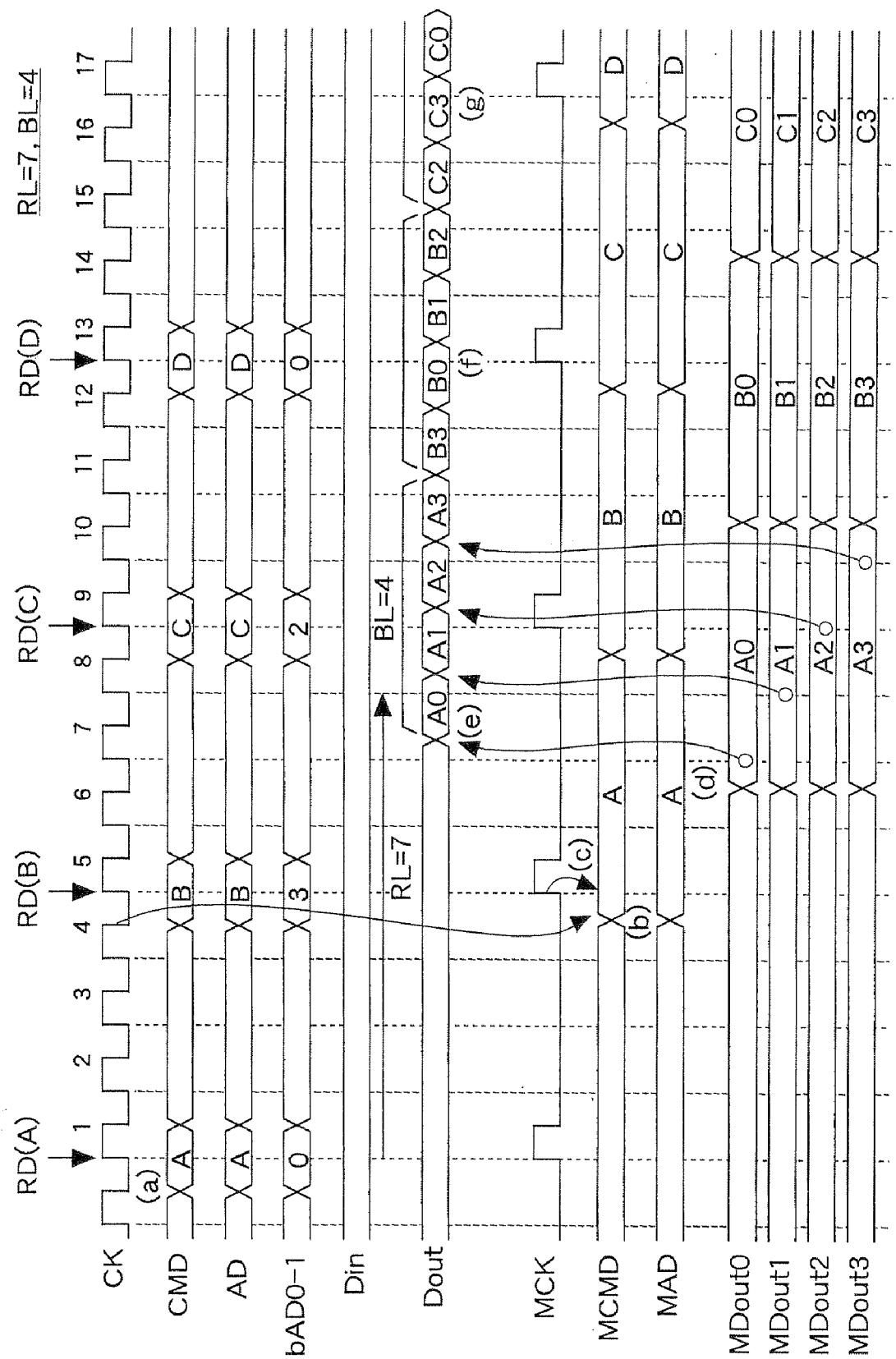
FIG. 7 illustrates a timing chart showing a read operation of the first embodiment.
Figure 8:
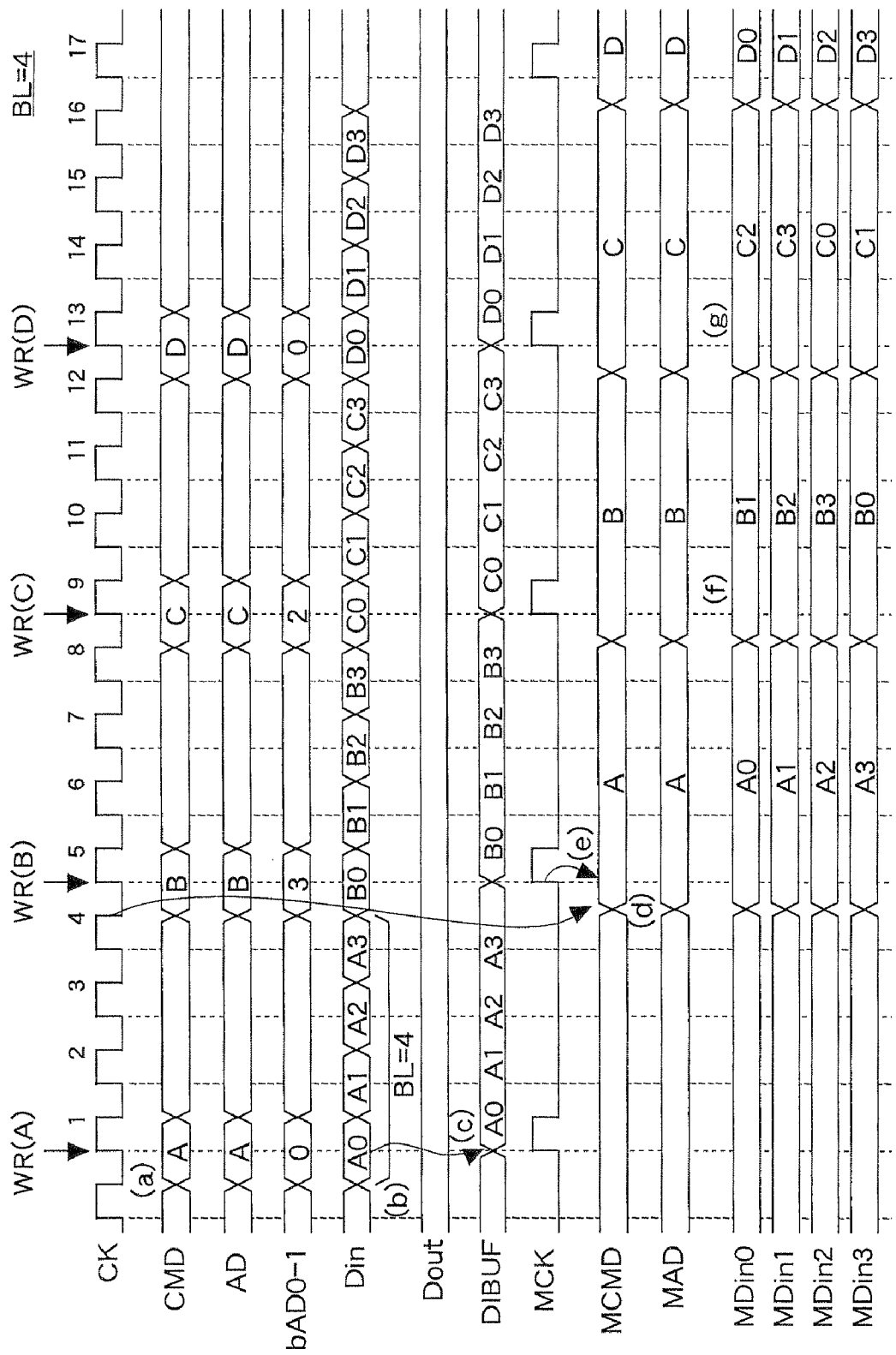
FIG. 8 illustrates a timing chart showing a write operation of the first embodiment.

The clock control circuit 22 outputs the memory clock signal MCK every four pulses of the clock signal CK. The clock control circuit 22 outputs the output clock signal OUTCK in synchronization with the falling edge of the 3rd clock pulse ICK (ICK4 or ICK16 in the view) after receiving the read command RD or the write command WR. Moreover, the clock control circuit 22 outputs the clock signal RCK in synchronization with the 6th to 9th clock pulses ICK7-10 after receiving the read command RD, and outputs the write clock signal WCK in synchronization with a clock pulse ICK13, at which the write command WR is received, and the subsequent three clock pulses ICK14-16. The detailed operation of BL=1 is illustrated in FIG. 7 and FIG. 8.

Figure 10:
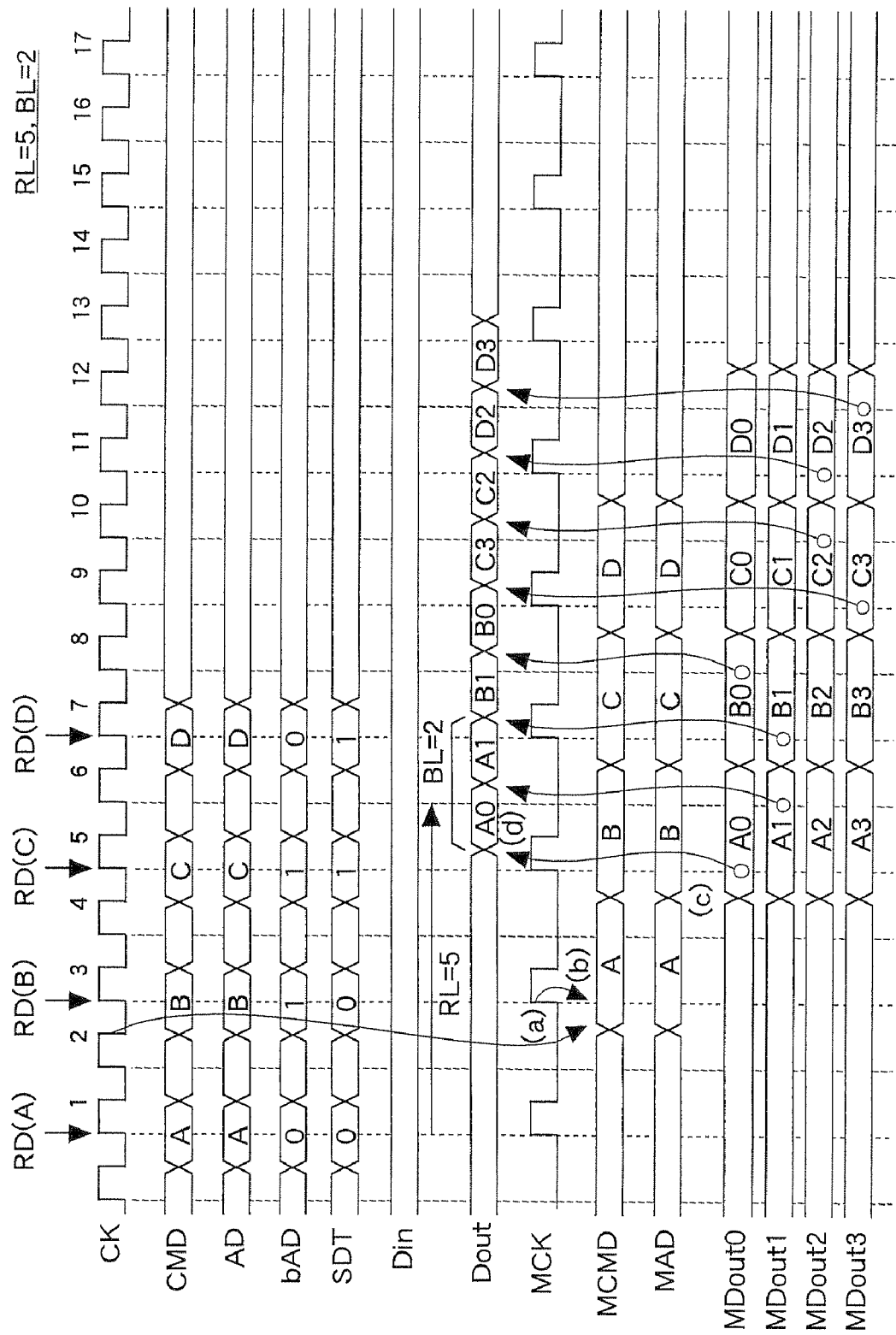
FIG. 10 illustrates a timing chart showing a read operation of the second embodiment.
Figure 11:
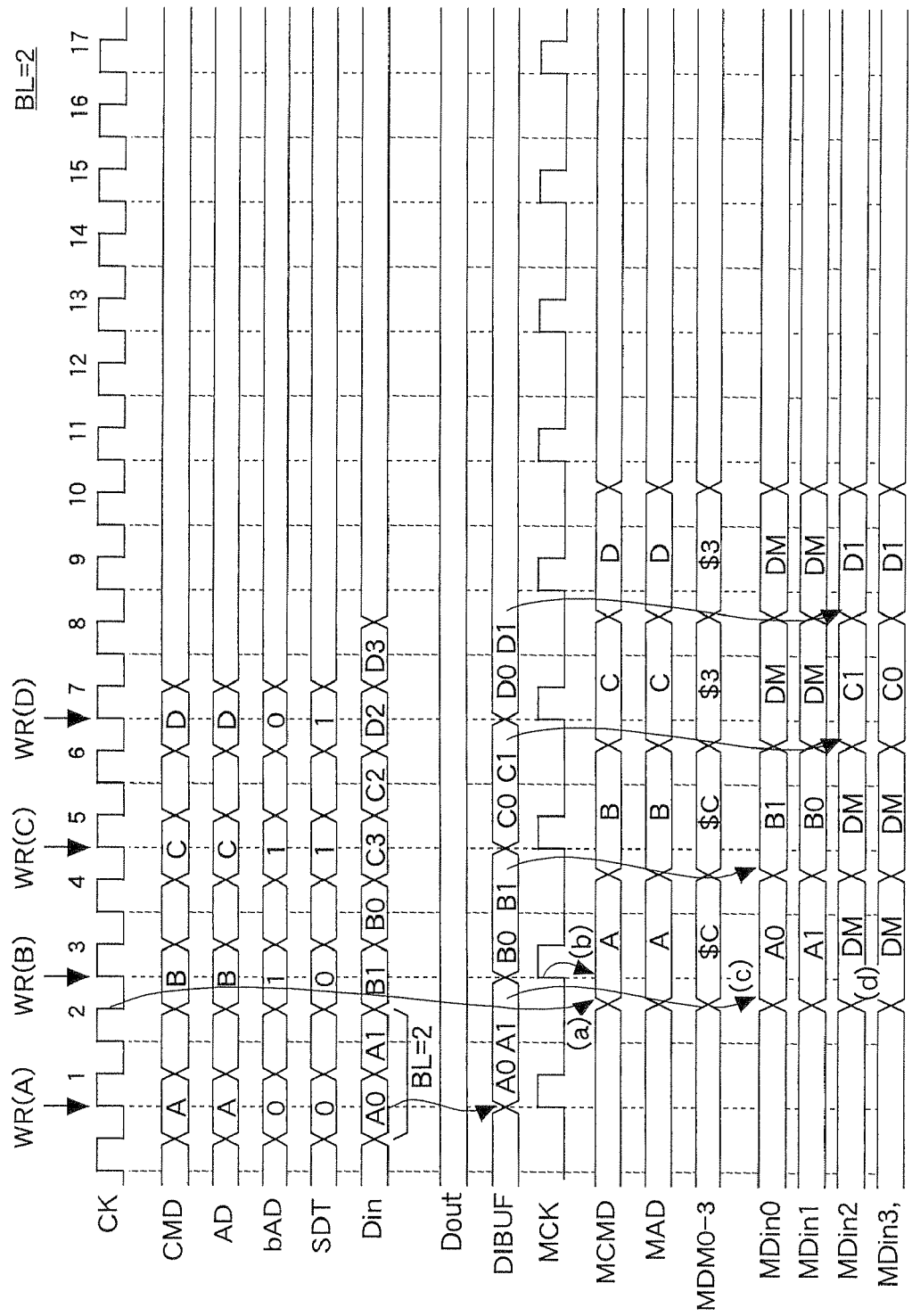
FIG. 11 illustrates a timing chart showing a write operation of the second embodiment.

In the case of BL=2, the memory clock signal MCK is output every two pulses of the clock signal CK. The output clock signal OUTCK is output in synchronization with the falling edge of the next clock pulse ICK2 or ICK14 after receiving the read command RD or the write command WR. The read clock signal RCK is output in synchronization with the 4th to 5th clock pulses ICK5-6 after receiving the read command RD. The write clock signal WCK is output in synchronization with the clock pulse ICK13, at which the write command WR is received, and the subsequent clock pulse ICK14. The detailed operation of BL=2 is illustrated in FIG. 10 and FIG. 11.

Figure 13:
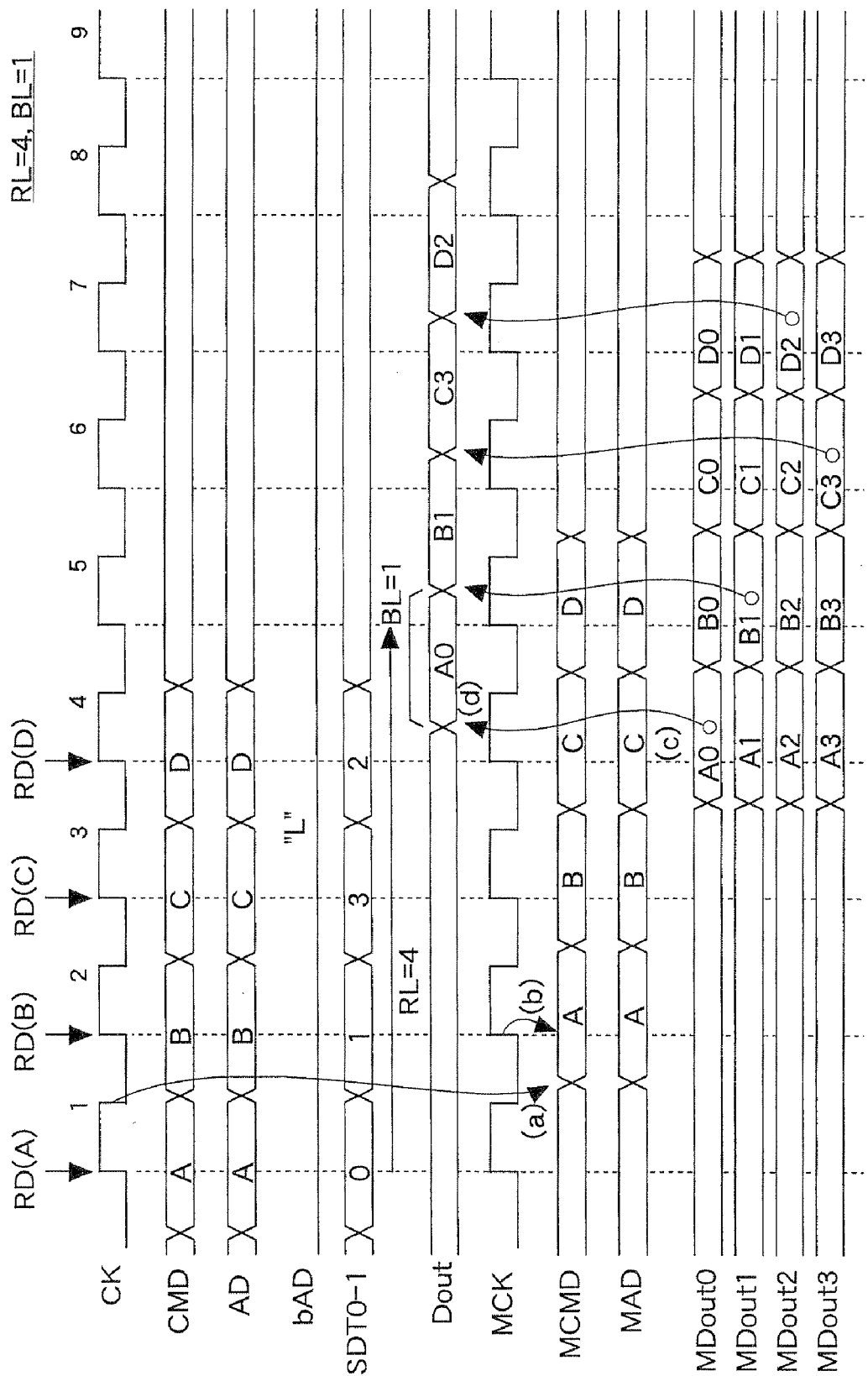
FIG. 13 illustrates a timing chart showing a read operation of the third embodiment.
Figure 14:
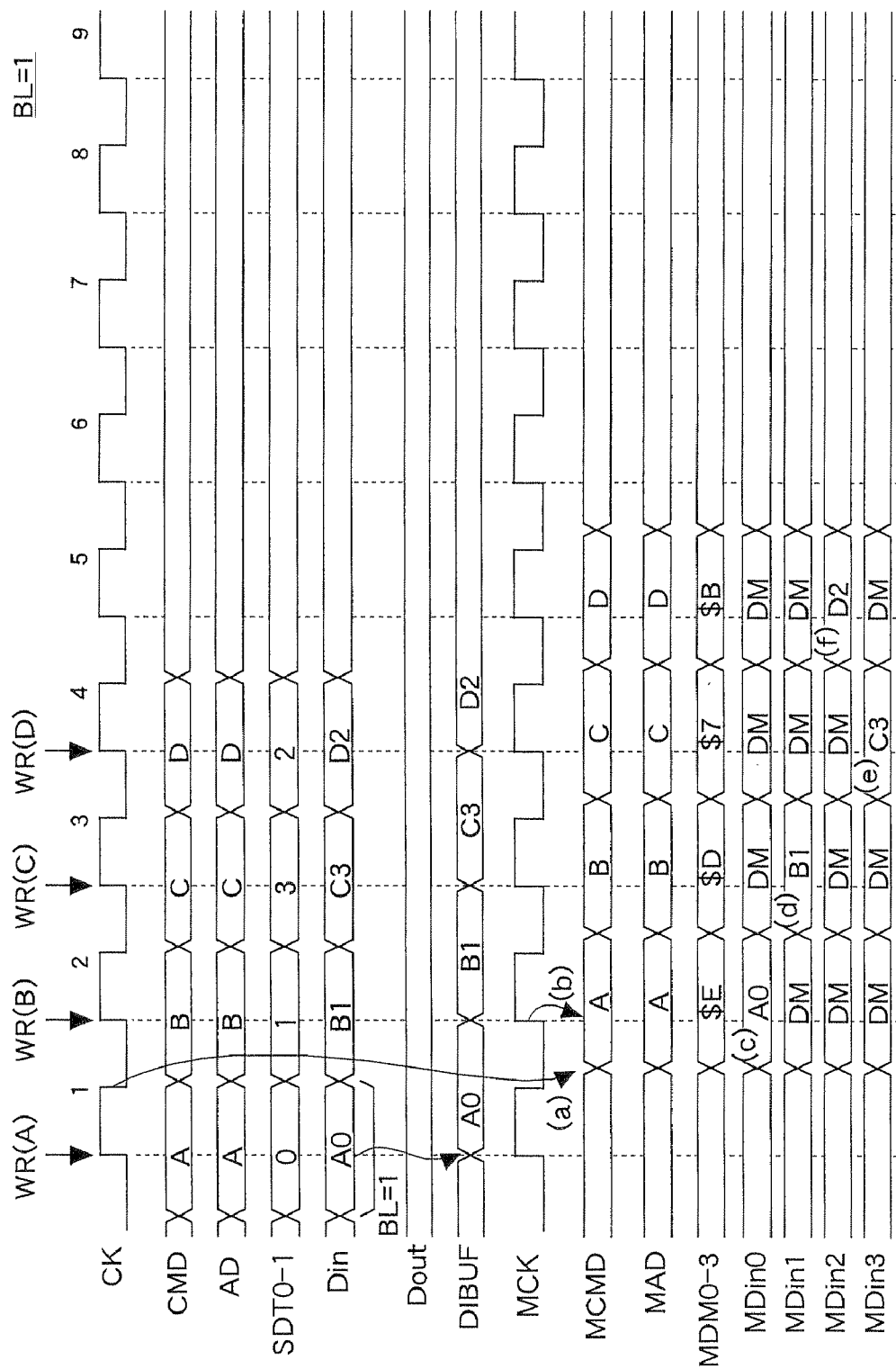
FIG. 14 illustrates a timing chart showing a write operation of the third embodiment.

In the case of BL=1, the memory clock signal MCK is output in synchronization with the clock signal CK. The output clock signal OUTCK is output in synchronization with the falling edge of the clock signal CK at which the read command RD or the write command WR is received. The read clock signal RCK is output in synchronization with the 3rd clock pulse ICK4 after receiving the read command RD. The write clock signal WCK is output in synchronization with the clock pulse ICK13 at which the write command WR is received. The detailed operation of BL=1 is illustrated in FIG. 13 and FIG. 14.

In addition, the controller CTRL1 or CTRL2 shown in FIG. 1 outputs the read command RD and the write command WR in synchronization with the memory clock signal MCK. For this reason, for example, the controller CTRL1 or CTRL2 recognizes the clock pulse CK that is synchronized with the memory clock pulse MCK at the time of power-on of the SoC. Moreover, when the refresh command CMD (REF) is supplied, the clock control circuit 22 generates only the memory clock signal MCK and output clock signal OUTCK, and does not generate the read clock signal RCK and write clock signal WCK.

FIG. 5 illustrates the operation of the data clock generation circuit 32 shown in FIG. 2. In this embodiment, the bit width (1N of FIG. 2) of a data signal that is input and output to the memory bus MBUS is one fourth of the bit width (4N of FIG. 2) of a data signal that is input and output to the memory MEM. In other words, the number of bits of the memory data input signals MDin0-3 (write data signal) that are output from the interface conversion macro IFCV to the memory macro MEM is four times (integer multiple) the number of bits of the data input signal Din (write data signal) that is output from the controller CTRL1 or CTRL2 to the interface conversion macro IFCV. Moreover, the number of bits of the memory data output signals MDout0-3 (read data signal) that are output from the memory macro MEM to the interface conversion macro IFCV is four times (integer multiple) the number of bits of the data output signal Dout (read data signal) that is output from the interface conversion macro IFCV to the controller CTRL1 or CTRL2.

For this reason, in order to write the data signal Din to the memory MEM, it is necessary to select which of the memory data input signals MDin0-3 the data signal Din is to be supplied to. Moreover, it is necessary to select which of the memory data output signals MDout0-3 read from the memory MEM is to be output as the data output signal Dout. The data clock generation circuit 32 generates the data input clock signals DICK0-3 or data output clock signals DOCK0-3 in response to the value of the burst address signal bAD0-1 (start address SAD) in order to select a data signal.

For example, when the value of the burst address signal bAD0-1 that are supplied to the interface conversion macro IFCV along with the read command RD is "0", the data clock generation circuit 32 sequentially outputs the output clock signals DOCK0-3 in synchronization with the read clock signal RCK. Accordingly, four serial write data signals Din are converted to a parallel write data signal, which is then transmitted to the memory data input signal lines MDin0-3. When the value of the burst address signal bAD0-1 that is supplied to the interface conversion macro IFCV along with the write command WR is "2", the data clock generation circuit 32 sequentially outputs the data input clock signals DICK2-3, 0-1 in synchronization with the write clock signal WCK. Accordingly, the parallel memory output data signals MDout2-3, 0-1 are sequentially output as the serial data output signal Dout.

On the other hand, as shown in the second embodiment, when the burst length BL is "2", a data clock generation circuit 32A (FIG. 9) sequentially outputs two of the output clock signals DOCK0-3 in synchronization with the read clock signal RCK. As shown in the third embodiment, when the burst length BL is "1", a data clock generation circuit 32B (FIG. 12) outputs either of the output clock signals DOCK0-3 in synchronization with the read clock signal RCK.

Figure 6:
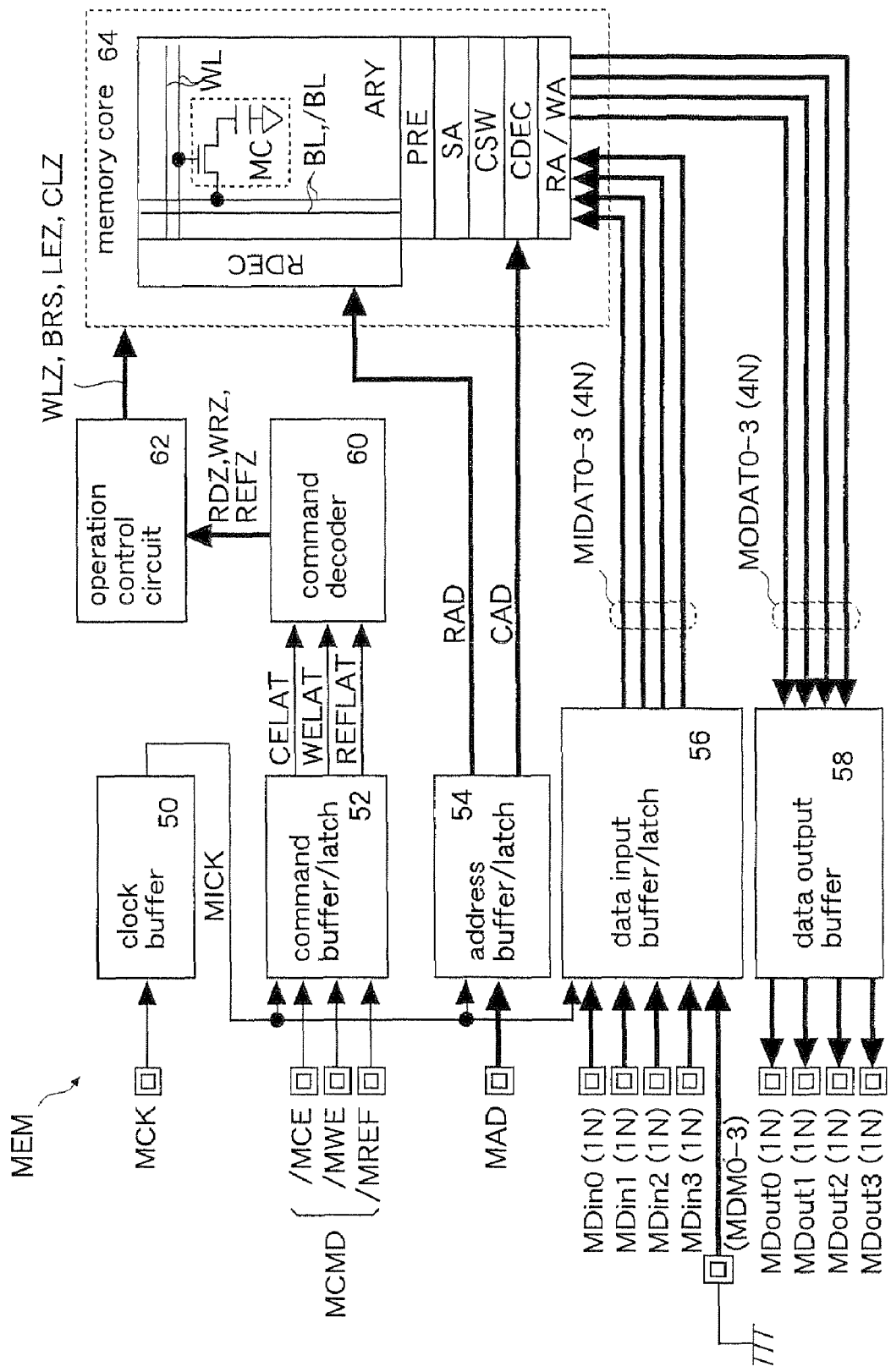
FIG. 6 illustrates a block diagram showing a memory macro shown in FIG. 1.

FIG. 6 illustrates the memory macro MEM shown in FIG. 1. The memory macro MEM includes a clock buffer 50, a command buffer/latch 52, an address buffer/latch 54, a data input buffer/latch 56, a data output buffer 58, a command decoder 60, an operation control circuit 62, and a memory core 64. The clock buffer 50, command buffer/latch 52, address buffer/latch 54, data input buffer/latch 56, and data output buffer 58 function as a memory interface part that inputs and outputs signals compliant with the memory interface specification.

The clock buffer 50 outputs the memory clock signal MCK as an internal clock signal MICK. The command buffer/latch 52 latches the memory command signal MCMD in synchronization with the internal clock signal MICK, and outputs the latched signal as a latched chip enable signal CELAT, a latched write enable signal WELAT, and a latched refresh signal REFLAT. The address buffer/latch 54 latches the memory address signal MAD in synchronization with the internal clock signal MICK, and outputs the latched signal as a row address signal RAD and a column address signal CAD.

The data input buffer/latch 56 latches the memory data input signals MDin0-3 in synchronization with the internal clock signal MICK, and outputs the latched signals as memory data input signals MIDAT0-3. In addition, in this embodiment, data mask terminals MDM0-3 of the data input buffer/latch 56 are coupled to a ground line to disable a data mask function. The data output buffer 58 receives memory data output signals MODAT0-3 output from the memory core 64, and outputs the received signals as the memory data output signals MDout0-3.

The command decoder 60 decodes the command signals CELAT, WELAT, and REFLAT, and outputs a read control signal RDZ for executing the read operation, a write control signal WRZ for executing the write operation, or a refresh control signal REFZ for executing the refresh operation.

The operation control circuit 62 outputs operation control signals (a word line activation signal WLZ, a precharge control signal BRS, a sense amplifier activation signal LEZ, and a column selection signal CLZ) in order to cause the memory core 64 to execute the read operation, the write operation, or the refresh operation in response to the control signals RDZ, WRZ, and REFZ. The word line activation signal WLZ controls the activation timing of a word line WL. The precharge control signal BRS controls the ON/OFF timing of a precharge circuit PRE. The sense amplifier activation signal LEZ controls the activation timing of a sense amplifier SA. The column selection signal CLZ controls the ON/OFF timing of a column switch CSW.

The memory core 64 includes a memory cell array ARY, a row decoder RDEC, a precharge circuit PRE, the sense amplifier SA, the column switch CSW, a column decoder CDEC, a read amplifier RA, and a write amplifier WA. The memory cell array ARY includes a plurality of dynamic memory cells MC, a plurality of word lines WL coupled to the memory cells MC that are arranged in the horizontal direction in the view, and a plurality of bit line pairs BL, /BL coupled to the memory cells MC that are arrange in the vertical direction in the view. The memory cell MC includes a capacitor that holds data as an electric charge, and a transfer transistor for coupling one end of this capacitor to the bit line BL (or /BL). The other end of the capacitor is coupled to a precharge voltage line. The gate of the transfer transistor is coupled to the word line WL. Upon selection of the word line WL, either of the read operation, the write operation or the refresh operation is executed.

The row decoder RDEC decodes the row address signal RAD in order to select either of the word lines WL. The precharge circuit PRE couples the bit line pair BL, /BL to the precharge voltage line in synchronization with the precharge control signal BRS during non-access to the memory cell MC. The sense amplifier SA amplifies a difference in the signal amounts of data signals that are read to the bit line pair BL and /BL. The column address decoder CDEC decodes the column address signal CAD in order to select the bit line pair BL, /BL through which a data signal is input and output. The column switch CSW couples the bit lines BL, /BL corresponding to the column address signal CAD to the read amplifier RA and the write amplifier WA. During the read operation, the read amplifier RA amplifies a read data signal that is output via the column switch CSW, and outputs the amplified signal as the memory data output signals MODAT0-3. During the write operation, the write amplifier WA amplifies the supplied memory data input signals MIDAT0-3 and supplies the amplified signals to the bit line pair BL, /BL.

FIG. 7 illustrates the read operation of the first embodiment. In this example, the read command RD is supplied every four clock cycles. For example, the interface conversion macro IFCV receives the command signal CMD (A), the address signal AD (A), and the burst address signal bAD0-1 (0) in synchronization with the rising edge of the first pulse (CK1) of the clock signal CK (FIG. 7(a)). The clock control circuit 22 shown in FIG. 2 outputs the received command signal CMD (A) and address signal AD (A) as the memory command signal MCMD (A) and memory address signal MAD (A) in synchronization with the falling edge of the 4th clock pulse CK (FIG. 7(b)).

In synchronization with the memory clock pulse MCK corresponding to the 5th clock pulse CK, the memory MEM receives the memory command signal MCMD (A) and the memory address signal MAD (A), and starts the read operation (FIG. 7(c)). The memory MEM outputs read data signals from the memory core 64 as the memory data output signals MDout0-3 (A0-A3; read data) (FIG. 7(d)). The memory data output signals MDout0-3 are output at a time (e.g., the 6th clock pulse CK) corresponding to the falling edge of the next clock pulse CK of the clock pulse CK at which the memory command signal MCMD (A) is received. In this way, the memory MEM is designed so as to output the read data A0-3 after 1.5 clocks (e.g., at the falling edge of CK6) after receiving the read command MCMD. Accordingly, when the controller that accesses the memory MEM is coupled directly to the memory MEM, the controller can receive the read data after 2 clocks (e.g., CK7) from outputting the read command MCMD. Namely, the memory MEM itself operates at the read latency RL=2.

Since the value of the burst address signal bAD0-1 is "0", the data clock generation circuit 32 of the interface conversion macro IFCV sequentially outputs the output clock signals DOCK0-3 in synchronization with the 7th to 10th clock pulses C1(, as shown in FIG. 5. The parallel/serial conversion circuit 36 shown in FIG. 2 sequentially outputs read data signals A0, A1, A2, and A3 as the data output signal ODAT in synchronization with the output clock signals DOCK0-3, respectively. Then, the read data signals A0-A3 are sequentially output from the data output buffer 20 to the data output terminal Dout (FIG. 7(e)). The controller CTRL1 or CTRL2 shown in FIG. 1 receives the read data signals A0-A3 in synchronization with the 8th to 11th clock pulses CK. Namely, the number of clocks (read latency RL) after the controller CTRL1 or CTRL2 outputs the read command RD to the interface conversion macro IFCV until it receives the first read data signal A0 is "7".

The read operation associated with the 2nd or subsequent read command RD (B-D) is also executed in the same manner as described above. However, the output order of read data signals output from the data output terminal Dout varies in response to the value of the burst address signal bAD0-1. Namely, when the value of the burst address signal bAD0-1 is "3", the read data signals are output in the order of the data output signals MDout3, 0-2 (FIG. 7(f)). When the value of the burst address signal bAD0-1 is "2", the read data signals are output in the order of the data output signal MDout2-3, 0-1 (FIG. 7(g)).

In addition, the refresh operation of the memory MEM that responds to the refresh command REF is executed at the same timing as that of the read operation except that the memory data output signals MDout0-3 are not output from the memory MEM.

FIG. 8 illustrates the write operation of the first embodiment. In this example, the write command WR is supplied every four clock cycles. The interface conversion macro IFCV receives the command signal CMD (A), the address signal AD (A), and the burst address signal bAD0-1 (0) in synchronization with the rising edge of the clock signal CK (FIG. 8(a)). Moreover, the interface conversion macro IFCV sequentially receives write data signals A0, A1, A2, and A3 at the data input terminal Din (FIG. 8(b)) in synchronization with the 1st to 4th clock pulses CK. The write data hold circuit WHLD of the serial/parallel conversion circuit 34 sequentially holds the write data signals A0-A3 in synchronization with the data input clock signals DICK0-3 (FIG. 8(c)). Here, the write data hold circuit WHLD holds the write data signals A0-A3 into four buffers corresponding to the memory data input signals MDin0-3 in response to the value of the burst address signal bAD0-1. The locations of the buffers for holding the write data signals A0-A3 are determined by the output clock signals DOCK0-3 (FIG. 5) output from the data clock generation circuit 32.

The clock control circuit 22 shown in FIG. 2 outputs the output clock signal OUTCK in synchronization with the falling edge of the 4th clock pulse CK (not shown). The command register 28 and the address register 30 output the received command signal CMD (A) and address signal AD (A) as the memory command signal MCMD (A) and memory address signal MAD (A) (FIG. 8(d)). The memory MEM receives the memory command signal MCMD (A), the memory address signal MAD (A), and the write data signals A0-A3 in synchronization with the memory clock pulse MCK corresponding to the 5th clock pulse CK, and starts the write operation (FIG. 8(e)).

The write operation associated with the 2nd or subsequent write command WR (B-D) is also executed in the same manner as described above. However, the memory data input signal lines MDin0-3 through which the write data signals A0-A3 are transmitted vary in response to the value of the burst address signal bAD0-1. Namely, when the value of the burst address signal bAD0-1 is "3", the write data signals A0-A3 are supplied to the memory data input signal lines MDin3, 0-2, respectively (FIG. 8(f)). When the value of the burst address signal bAD0-1 is "2", the write data signals A0-A3 are supplied to the memory data input signal lines MDin2-3, 0-1, respectively (FIG. 8(g)).

As described above, in the first embodiment, by converting the system interface specification and the memory interface specification to each other by the interface conversion macro IFCV, the common memory macro MEM can be mounted on the SoC (semiconductor integrated circuit) even when the system interface specification differs. Accordingly, in designing the system SYS, the design verification time and evaluation time of the memory macro MEM can be reduced. In other words, the design verification time, evaluation time, and test time of SoC can be reduced. For example, the test time is reduced by reducing the number of test items when the reliability in the market has been secured in accordance with the shipped quantity of the memory macro MEM. As a result, the design time and design cost of the SoC can be reduced.

For example, the interface specifications converted to each other include the burst length BL and the read latency RL. By changing the logic of the clock control circuit 22 in accordance with the burst length BL and the read latency RL, the data signal interface specifications can be converted to each other by the interface conversion macro IFCV and thus the memory macro MEM can be accessed without malfunctioning. Or, the interface specifications converted to each other includes the command signal CMD. By changing the logics of the command decoder 24, command conversion circuit 26, and the like in accordance with the interface specification of the command signal CMD output from the controllers CTRL1-2, the memory macro MEM can be accessed by the interface conversion macro IFCV without malfunctioning.

Figure 9:
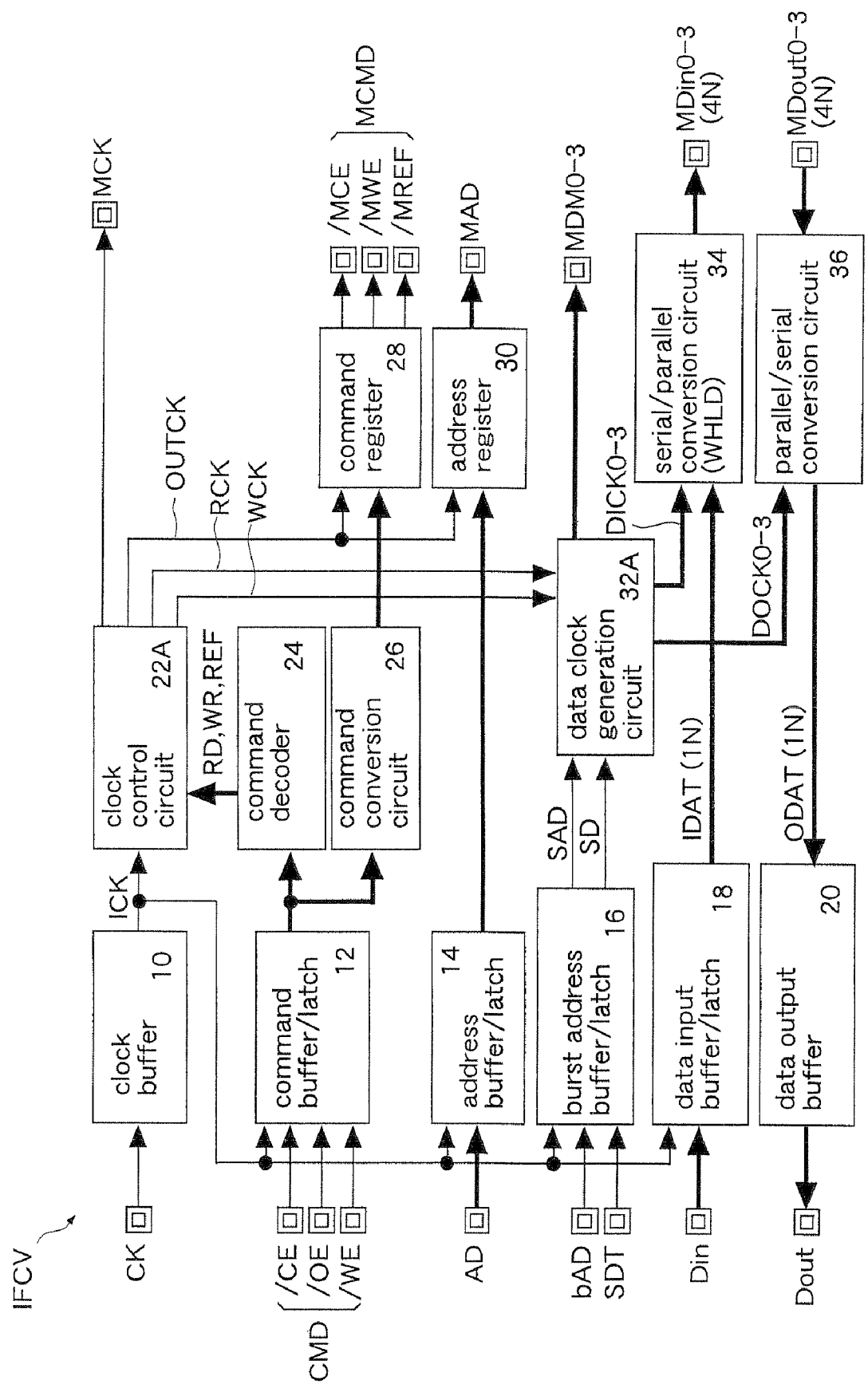
FIG. 9 illustrates a block diagram showing an interface conversion macro of a second embodiment.

FIG. 9 illustrates the interface conversion macro IFCV of the second embodiment. The same element as that described in the first embodiment is given the same reference numeral to omit the detailed description thereof. The interface conversion macro IFCV of this embodiment includes the clock control circuit 22A and the data clock generation circuit 32A in place of the clock control circuit 22 and the data clock generation circuit 32 of the interface conversion macro IFCV of the first embodiment. The configuration except that of the interface conversion macro IFCV is the same as that of the first embodiment.

The configuration of the system SYS of the second embodiment is the same as that of the first embodiment (FIG. 1). However, the controller macro CTRL1 or CTRL2 outputs a 1-bit burst address signal bAD and a 1-bit data selection address signal SDT in place of the 2-bit burst address signal bAD0-1. The memory macro MEM mounted on the SoC is the same as that of the first embodiment. In this embodiment, the access operation with the burst length BL=2 and the read latency RL=5 is executed by the interface conversion macro IFCV using the same memory macro MEM as that of the first embodiment. Since the burst length BL is "2", the number of serial read data signals Din that are output from the interface conversion macro IFCV to the controller CTRL1 or CTRL2 in response to the read command RD is fewer than the number of the parallel read data signals MDout0-3 that are output from the memory macro MEM.

During the write operation, the data selection address SDT indicates the location of the hold part for holding the serial write data signal IDAT. In other words, during the write operation, the hold parts corresponding to two of a group of four memory data input signal lines MDin0-3 are selected by the data selection address SDT. Then, two serial write data signals IDAT are output to the memory macro MEM as the selected two memory data input signals MDin. In addition, a total number of bits (64 bits) of the data input signal IDAT (serial write data signal) supplied for each write command WR is fewer than the number (128) of hold parts of the write data hold circuit WHLD.

During the read operation, two of a group of four memory data output signal lines MDout0-3 are selected by the data selection address SDT. Then, the selected memory data output signals MDout are output as the two serial read data signals ODAT.

The burst address buffer/latch 16 receives the burst address signal bAD and the data selection address signal SDT, and outputs these as the start address SAD and the data selection address SD. The clock control circuit 22A generates the memory clock signal MCK, the output clock signal OUTCK, the read clock signal RCK, and the write clock signal WCK corresponding to BL=2 and RL=5, as shown in FIG. 4.

The data clock generation circuit 32A generates successive two output clock signals among the output clock signals DOCK0-3 in synchronization with the read clock signal RCK, and generates successive two output clock signals among the data input clock signals DICK0-3 in synchronization with the write clock WCK. The order of generation of the output clock signals DOCK0-3 and the order of generation of the data input clock signals DICK0-3 are set in response to the value of the 1-bit start address SAD and the value of the 1-bit data selection address signal SDT. Moreover, during the write operation, the data clock generation circuit 32A outputs either of the data mask signals MDM0-1 or MDM2-3 in response to the data selection address SD in order to mask either one pair, to which a write data is not supplied, of the data input signals MDin0-1, 2-3.

In other words, during the read operation, the data clock generation circuit 32A selects the read data signal MDout0-1 or MDout2-3, which the controller CTRL1 or CTRL2 requires, among the parallel read data signals MDout0-3 in response to the data selection address signal SDT, and sequentially generates the data output clock signal DOCK corresponding to the selected read data signal MDout in response to the burst address signal bAD, and outputs the generated data output clock signal DOCK to the parallel/serial conversion circuit 36.

Moreover, during the write operation, the data clock generation circuit 32A selects the hold parts corresponding to two of a group of four memory data input signal lines MDin0-3 in response to the data selection address SDT indicative of the hold parts of the write data hold circuit WHLD, and sequentially generates the data input clock signal click corresponding to the selected hold part in response to the burst address signal bAD, and outputs the generated data input clock signal click to the serial/parallel conversion circuit 34, and at the same time, outputs the data mask signals MDM0-1 or MDM2-3 corresponding to the non-selected hold parts to the memory macro MEM. In addition, in this embodiment, the data mask terminals MDM0-3 of the memory macro MEM shown in FIG. 6 are coupled to the data mask terminals MDM0-3 of the interface conversion macro IFCV.

FIG. 10 illustrates the read operation of the second embodiment. The detailed description of the same operation as that of the first embodiment (FIG. 7) is omitted. In this example, the read command RD is supplied every two clock cycles. The interface conversion macro IFCV outputs the command signal CMD (A) and the address signal AD (A) to the memory MEM in synchronization with the falling edge of the next clock pulse CK of the clock pulse CK at which the read command RD is received (FIG. 10(a)). For example, in synchronization with the memory clock pulse MCK corresponding to the 3rd clock pulse CK, the memory MEM receives the memory command signal MCMD (A) and the memory address signal MAD (A), and starts the read operation (FIG. 10(b)).

The memory MEM outputs the memory data output signals MDout0-3 (read data A0-A3) at a time (e.g., the falling edge of CK4) corresponding to the falling edge of the next clock pulse CK of the clock pulse CK at which the memory command signal MCMD (A) is received (FIG. 10(c)).

Although not specifically illustrated, the data clock generation circuit 32A sequentially outputs the data output clock signals DOCK0-1 in synchronization with the 5th and 6th clock pulses CK. The data output clock signal DOCK to be output is determined in response to the start address SAD and the data selection address SDT. Since the data selection address signal SDT is "0", the data output signals MDout0-1, which are the upper data group, are selected. Then, the read data signals A0-A1 are sequentially output from the data terminal Dout (FIG. 10(d)). The controller CTRL1 or CTRL2 shown in FIG. 1 receives the read data signals A0-A1 in synchronization with the 6th to 7th clock pulses CK. Namely, the read latency RL of this embodiment is "5".

The read operation associated with the 2nd or subsequent read command RD (B-D) is also executed in the same manner as described above. However, a pair of data output signals MDout that are output from the data output terminal MDout, and the output order of the selected data output signals MDout vary in response to the value of the data selection address signal SDT and the value of the burst address signal bAD. Namely, when the data selection address signal SDT is "1", the data output signals MDout2-3 are output. For the data output signals MDout0-1 or 2-3, the data output signals MDout with an even numbered suffix are output first when the value of the burst address signal bAD is even (=0), while when the value of the burst address signal bAD is odd (=1), the data output signals MDout with an odd numbered suffix are output first.

FIG. 11 illustrates the write operation of the second embodiment. The detailed description of the same operation as that of the first embodiment (FIG. 8) is omitted. In this example, the write command WR is supplied every two clock cycles. The interface conversion macro IFCV outputs the command signal CMD (A) and the address signal AD (A) to the memory MEM in synchronization with the falling edge of the next clock pulse CK2 of the clock pulse CK2 at which the write command WR is received (FIG. 11(a)). For example, the memory MEM, in synchronization with the memory clock pulse MCK corresponding to the 3rd clock pulse CK, receives the memory command signal MCMD (A), the memory address signal MAD (A), and the write data signals (A0-1 in this example), and starts the write operation (FIG. 11(b)).

For example, in the write operation corresponding to the first write command WR (A), since the value of the burst address signal bAD is "0", the write data signal A0 supplied first is supplied to the memory MEM as the data input signal MDin0. The write data signal A1 supplied next is supplied to the memory MEM as the data input signal MDin1 (FIG. 11(c)). Moreover, since the value of the data selection address SDT is "0", the values of the data mask signals MDM0, 1, 2, 3 are set to L, L, H, H (namely, "$C" in hexadecimal). The memory MEM masks the transmission of the data input signals MDin2-3 in response to the data mask signals MDM0-3 (DM), and writes only the data input signals MDin0-1 to the memory core 64 (FIG. 11(d)).

The write operation associated with the 2nd or subsequent write command WR (B-D) is also executed in the same manner as described above. However, when the value of the data selection address SDT is "1", the value of the data mask signals MDM0-3 are set to "$3" in hexadecimal. In this case, the data input signals MDin0-1 are masked (DM) and only the data input signals MDin2-3 are written to the memory core 64. When the value of the burst address signal bAD is even (=0), the data input signal Din received first is transmitted to the data input terminal MDout with an even numbered suffix, while when the value of the burst address signal bAD is odd (=1), the data input signal Din received first is transmitted to the data input terminal MDout with an odd numbered suffix.

As described above, also in the second embodiment, the same effect as that of the first embodiment described above can be obtained. Furthermore, in this embodiment, even when the number of bits of the write data signal Din used in the controllers CTRL1-2 is fewer than the number of bits of the write data signals MDin0-3 supplied to the memory macro MEM, the write operation of the memory macro MEM can be executed successfully by the interface conversion macro IFCV. In this case, the serial write data signal Din can be output to any write data signal line MDin of the memory macro MEM in response to the burst address signal bAD. Or, in response to the data selection address SDT, only the necessary write data signal MDin can be written to the memory macro MEM while the writing of the other write data signals to the memory macro can be masked. Namely, the memory macro MEM can be accessed without malfunctioning.

Similarly, also when the number of bits of the read data signal Dout used in the controllers CTRL1-2 is fewer than the number of bits of the read data signal MDout that is output from the memory macro MEM, the read operation of the memory macro MEM can be executed successfully by the interface conversion macro IFCV. In this case, the parallel read data signals MDout0-3 that are output from the memory macro MEM can be output to the controller CTRL1 or CTRL2 in any order in response to the burst address signal bAD. Or, in response to the data selection address SDT, only arbitrary read data signal among the parallel read data signals MDout0-3 that are output from the memory macro MEM can be read. Namely, the memory macro can be accessed without malfunctioning.

In this way, even when the system interface specification differs, the interface conversion macro IFCV can prevent the malfunction of the memory macro MEM that is used in common in a plurality of systems SYS.

Figure 12:
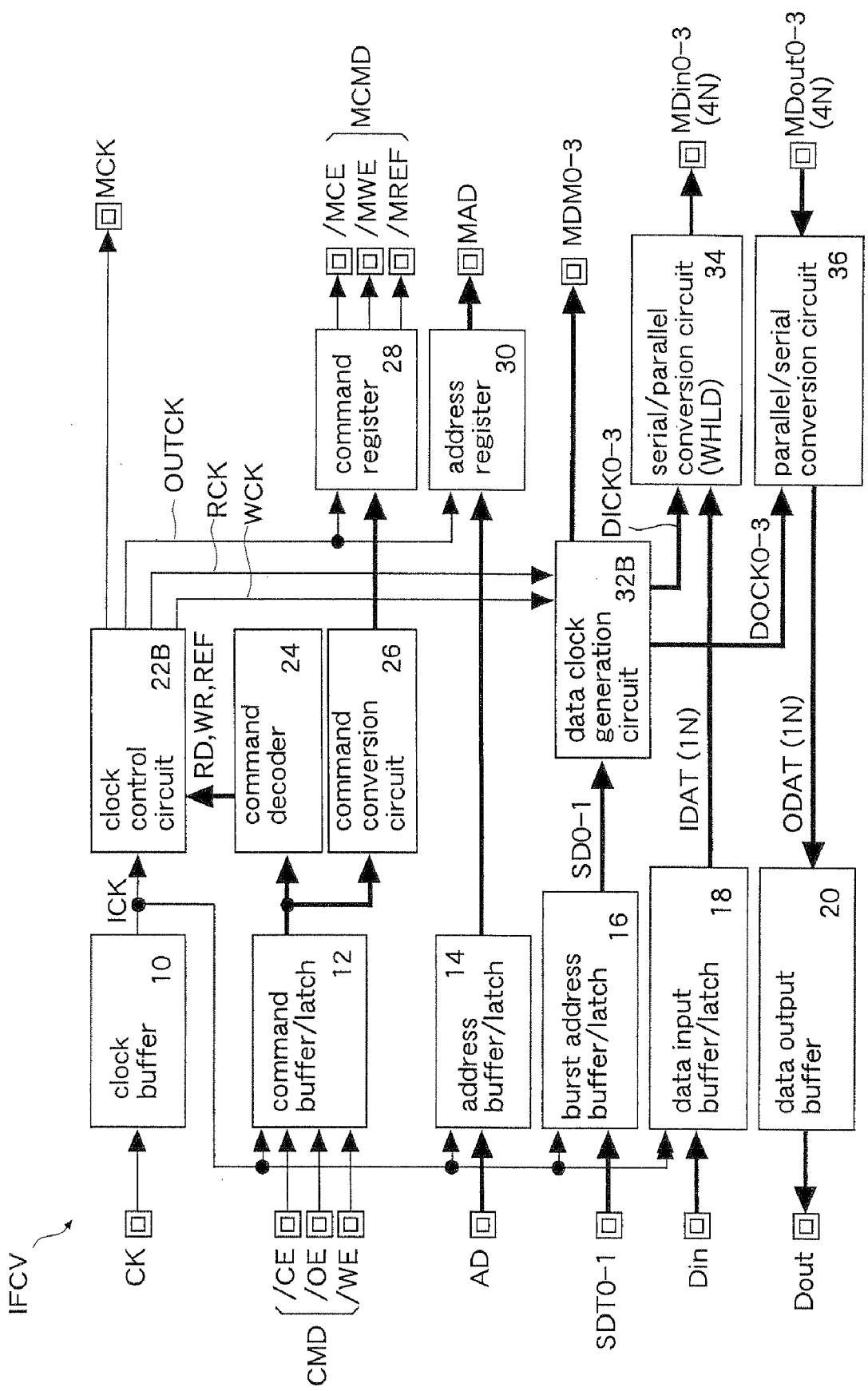
FIG. 12 illustrates a block diagram showing an interface conversion macro of a third embodiment.

FIG. 12 illustrates the interface conversion macro IFCV of the third embodiment. The same element as that described in the first and second embodiments is given the same reference numeral to omit the detailed description thereof. The interface conversion macro IFCV of this embodiment includes the clock control circuit 22B and the data clock generation circuit 32B in place of the clock control circuit 22 and the data clock generation circuit 32 of the interface conversion macro IFCV of the first embodiment. The configuration except that of the interface conversion macro IFCV is the same as that of the first embodiment.

The configuration of the system SYS of the third embodiment is the same as that of the first embodiment (FIG. 1). However, the controller macro CTRL1 or CTRL2 outputs a data selection address signal SDT0-1 in place of the burst address signal bAD0-1. The memory macro MEM mounted on the SoC is the same as that of the first embodiment. In this embodiment, the access operation with the burst length BL=1 and the read latency RL=4 is executed by the interface conversion macro IFCV using the same memory macro MEM as that of the first embodiment.

The burst address buffer/latch 16 receives the data selection address signal SDT0-1 and outputs the same as data selection address SD0-1. The clock control circuit 22B generates the memory clock signal MCK, the output clock signal OUTCK, the read clock signal RCK, and the write clock signal WCK corresponding to BL=1 and RL=4, as shown in FIG. 4.

The data clock generation circuit 32B generates either of the output clock signals DOCK0-3 in response to the data selection address SD0-1 during the read operation, while during the write operation it generates either of the data input clock signals DICK0-3 in response to the data selection address SD0-1. The output clock signals DOCK0-3 are generated in synchronization with the read clock signal RCK, and the data input clock signals DICK0-3 are generated in synchronization with the write clock WCK. Moreover, the data clock generation circuit 32B outputs the data mask signals MDM0-3 in response to the data selection address SD0-2 in order to supply only either of the data input signals MDin0-3 during the write operation.

In this way, in this embodiment, during the read operation, the data clock generation circuit 32A selects either of the read data signals MDout0-3, which the controller CTRL1 or CTRL2 requires, among the parallel read data signals MDout0-3 in response to the data selection address signal SDT, and generates the data output clock signal DOCK corresponding to the selected read data signal MDout, and outputs the generated data output clock signal DOCK to the parallel/serial conversion circuit 36.

Moreover, during the write operation, the data clock generation circuit 32B selects a hold part corresponding to either of a group of four memory data input signal lines MDin0-3 in response to the data selection address SDT indicative of the hold part of the write data hold circuit WHLD, and generates the data input clock signal click corresponding to the selected hold part, and outputs the generated data input clock signal click to the serial/parallel conversion circuit 34, and at the same time, outputs the data mask signals MDM0-3 corresponding to the non-selected hold parts to the memory macro MEM. In addition, in this embodiment, the data mask terminals MDM0-3 of the memory macro MEM shown in FIG. 6 are coupled to the data mask terminals MDM0-3 of the interface conversion macro IFCV.

FIG. 13 illustrates the read operation of the third embodiment. The detailed description of the same operation as that of the first and second embodiments (FIG. 7, FIG. 10) is omitted. In this example, the read command RD is supplied for each clock cycle. The interface conversion macro IFCV outputs the command signal CMD (A) and the address signal AD (A) to the memory MEM in synchronization with the falling edge of the clock pulse CK at which the read command RD is received (FIG. 13(a)). The memory MEM, for example, in synchronization with the memory clock pulse MCK corresponding to the 2nd clock pulse CK, receives the memory command signal MCMD (A) and the memory address signal MAD (A), and starts the read operation (FIG. 13(b)).

The memory MEM outputs the memory data output signals MDout0-3 (read data A0-A3) at a time (e.g., the falling edge of CK4) corresponding to the falling edge of the next clock pulse CK of the clock pulse CK at which the memory command signal MCMD (A) is received (FIG. 13(c)).

Although not specifically illustrated, the data clock generation circuit 32B outputs either of the data output clock signals DOCK0-3 in synchronization with the 4th clock pulse CK. The number of the data output clock signal DOCK to be output is the same as the value of the data selection address SDT0-1. Then, the read data signal A0 is output from the data output terminal Dout in synchronization with the 4th clock pulse data CK (FIG. 13(d)). The controller CTRL1 or CTRL2 shown in FIG. 1 receives the read data signal A0 in synchronization with the 5th clock pulse CK. Namely, the read latency RL of this embodiment is "4". The read operation associated with the 2nd or subsequent read command RD (B-D) is also executed in the same manner as described above.

FIG. 14 illustrates the write operation of the third embodiment. The detailed description of the same operation as that of the first and second embodiments (FIG. 8, FIG. 11) is omitted. In this example, the write command WR is supplied for each clock cycle. The interface conversion macro IFCV outputs the command signal CMD (A) and the address signal AD (A) to the memory MEM in synchronization with the failing edge of the clock pulse CK2 at which the write command WR is received (FIG. 14(a)). The memory MEM, for example, in synchronization with the memory clock pulse MCK corresponding to the 2nd clock pulse CK, receives the memory command signal MCMD (A), the memory address signal MAD (A), and the write data signal (A0 in this example), and starts the write operation (FIG. 14(b)).

For example, in the write operation corresponding to the first write command WR (A), since the value of the data selection address SDT is "0", the write data signal A0 supplied first is supplied to the memory MEM as the data input signal MDin0 (FIG. 14(c)). Since the value of the data selection address SDT is "1" in the write operation corresponding to the next write command WR (B), the write data signal B1 is supplied to the memory MEM as the data input signal MDin1 (FIG. 14(d)). Since the value of the data selection address SDT is "3" in the write operation corresponding to the next write command WR (C), the write data signal C3 is supplied to the memory MEM as the data input signal MDin3 (FIG. 14(e)). Since the value of the data selection address SDT is "2" in the write operation corresponding to the next write command WR (D), the write data signal D2 is supplied to the memory MEM as the data input signal MDin2 (FIG. 14(f)). In addition, the data clock generation circuit 32B outputs either three of the data mask signals MDM0-3 corresponding to non-selected hold parts to the memory macro MEM in response to the data selection address SDT01-1, as in the second embodiment. As described above, also in the third embodiment, the same effect as the first and second embodiments described above can be obtained.

Figure 15:
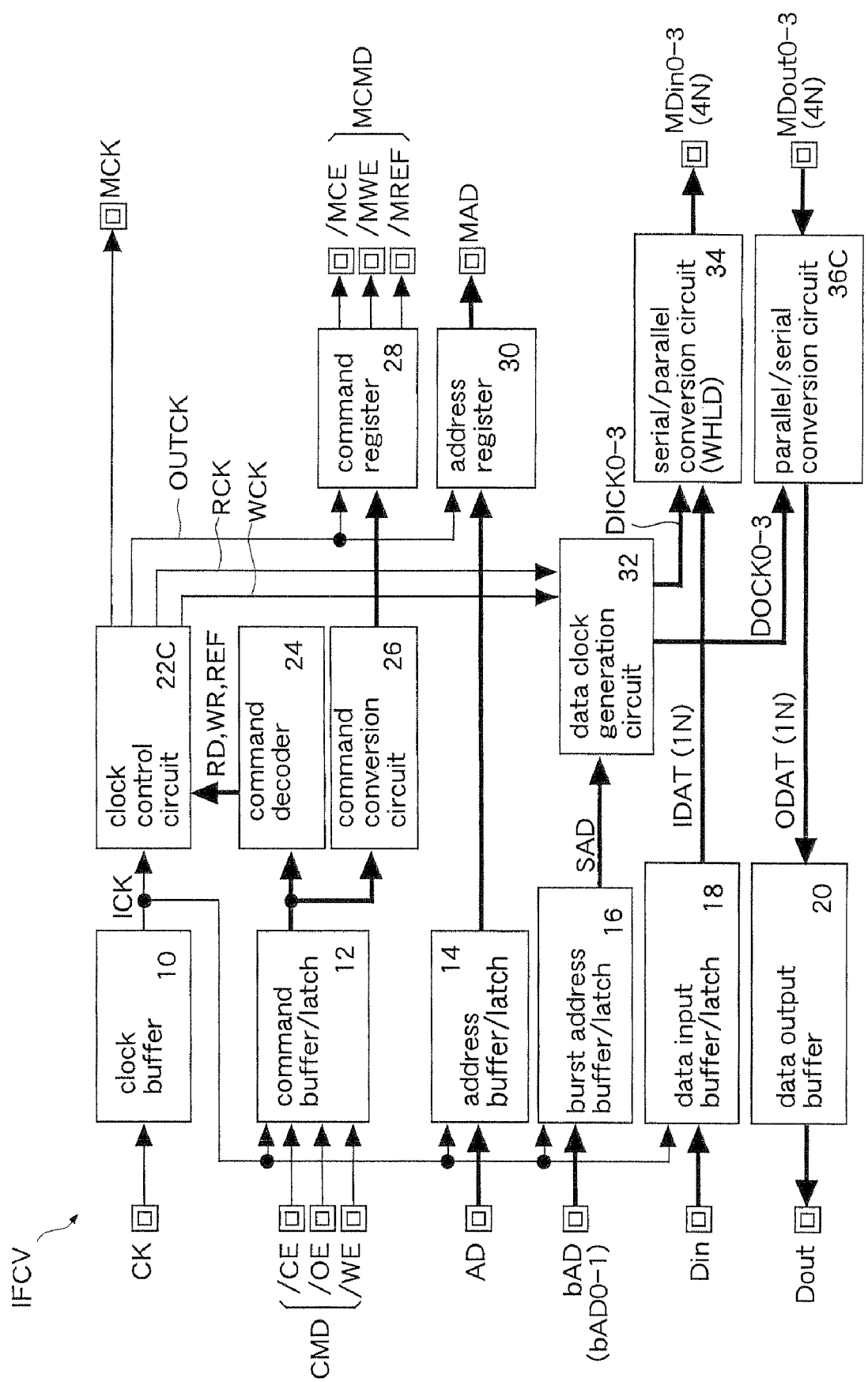
FIG. 15 illustrates a block diagram showing an interface conversion macro of a fourth embodiment.

FIG. 15 illustrates the interface conversion macro IFCV of the fourth embodiment. The same element as that described in the first embodiment is given the same reference numeral to omit the detailed description thereof. The interface conversion macro IFCV of this embodiment includes a clock control circuit 22C and a parallel/serial conversion circuit 36C in place of the clock control circuit 22 and parallel/serial conversion circuit 36 of the interface conversion macro IFCV of the first embodiment. The configuration except that of the interface conversion macro IFCV is the same as that of the first embodiment.

The configuration of the system SYS of the fourth embodiment is the same as that of the first embodiment (FIG. 1). However, the controller macro CTRL1 or CTRL2 executes the access operation at the burst length BL=4 and the read latency RL=9. The clock control circuit 22C delays the output timing of the read clock signal RCK by only two clock cycles as compared with that of the first embodiment in order to achieve the read latency RL=9. The parallel/serial conversion circuit 36C includes a read data hold circuit RHLD, which temporarily holds the memory output data signals MDout0-3 read from the memory MEM, in order to achieve the read latency RL=9.

Figure 16:
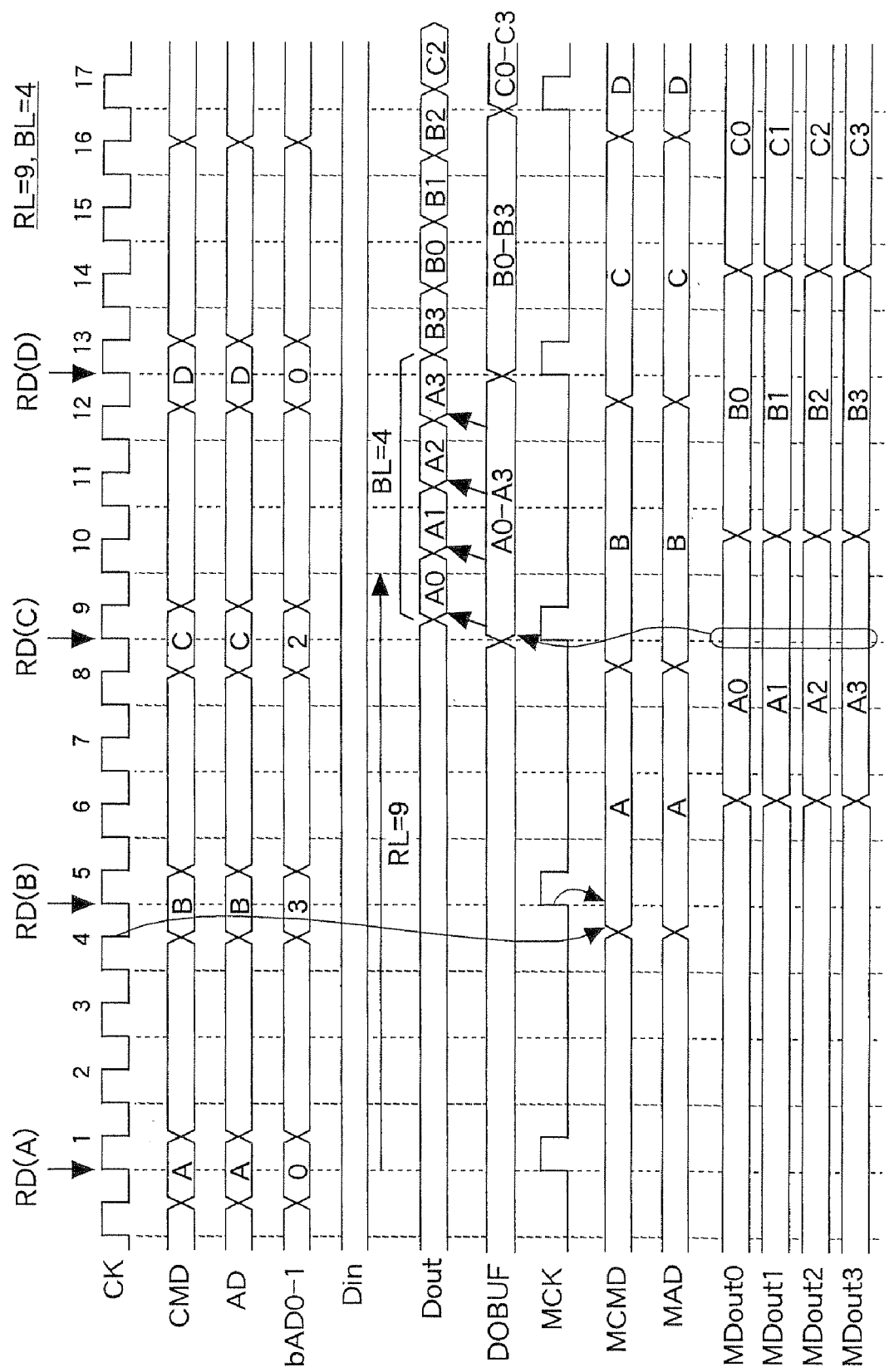
FIG. 16 illustrates a timing chart showing a read operation of the fourth embodiment.

FIG. 16 illustrates the read operation of the fourth embodiment. The detailed description of the same operation as that of the first embodiment (FIG. 7) is omitted. The timing until the data output signals MDout0-3 (read data) are output from the memory MEM is the same as that of FIG. 7. The interface conversion macro IFCV holds the data output signals MDout0-3 into the read data hold circuit RHLD in synchronization with the 8th clock pulse (e.g., CK9) after the read command RD is supplied (FIG. 16(a)). Then, the read data signals A0-A3 are sequentially output from the data terminal Dout in synchronization with the 9th to 12th clock pulses CK (FIG. 16(b)). The controller CTRL1 or CTRL2 shown in FIG. 1 sequentially receives the read data signals A0-A3 in synchronization with the 10th to 13th clock pulses CK. Namely, the read latency RL of this embodiment is "9".

Figure 17:
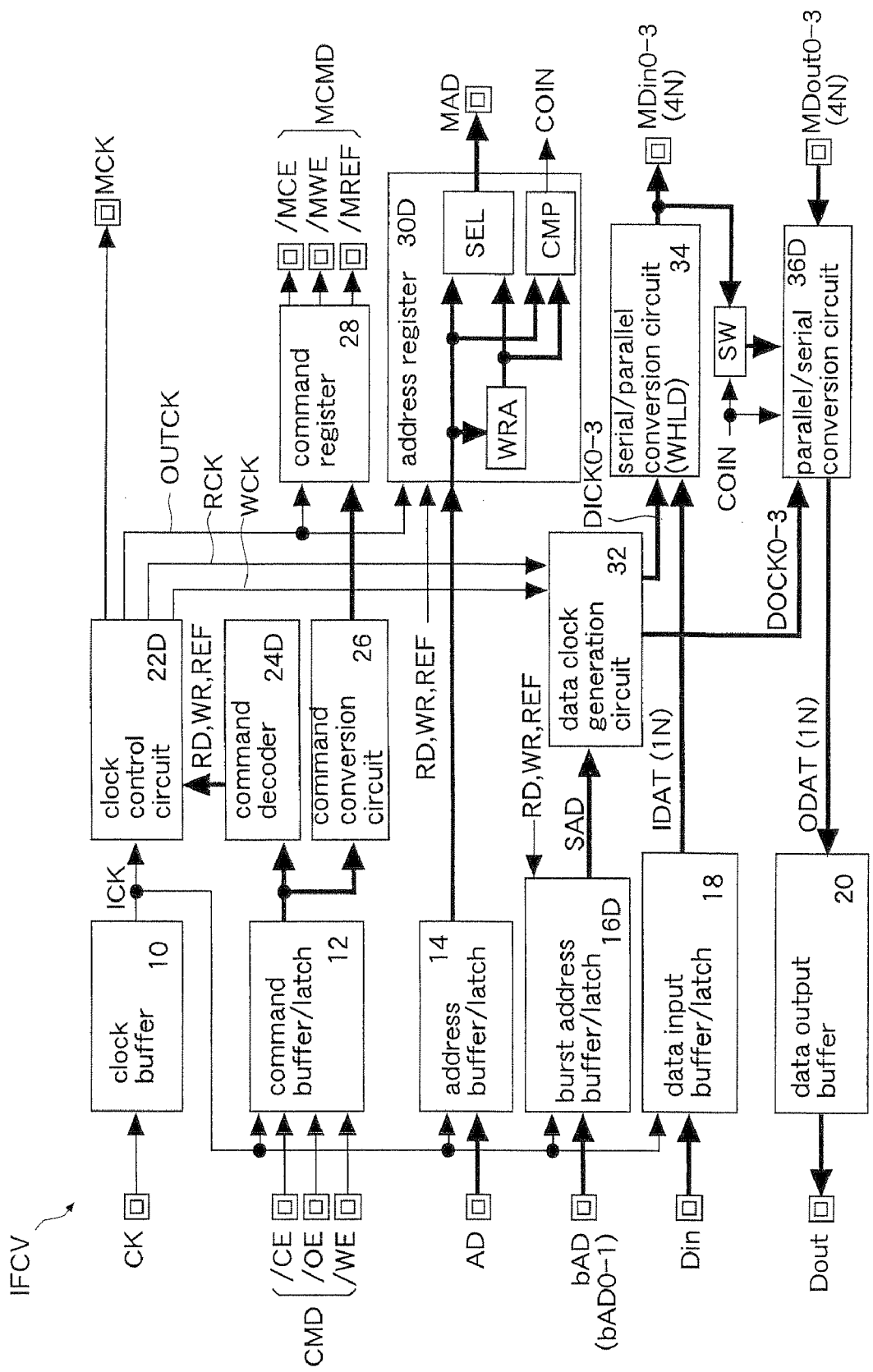
FIG. 17 illustrates a block diagram showing an interface conversion macro of a fifth embodiment.

In addition, the write operation is the same as that of the first embodiment (FIG. 8). As described above, also in the fourth embodiment, the same effect as that of the first embodiment described above can be obtained. FIG. 17 illustrates the interface conversion macro IFCV of the fifth embodiment. The same element as that described in the first embodiment is given the same reference numeral to omit the detailed description thereof. The interface conversion macro IFCV of this embodiment includes a burst address buffer/latch 16D, a clock control circuit 22D, a command decoder 24D, an address register 30D, and a parallel/serial conversion circuit 36D in place of the burst address buffer/latch 16, clock control circuit 22, command decoder 24, address register 30, and parallel/serial conversion circuit 36 of the interface conversion macro IFCV of the first embodiment. Moreover, the interface conversion macro IFCV includes a switch SW for transferring the memory data input signal MDin to the parallel/serial conversion circuit 36D. The configuration except that of the interface conversion macro IFCV is the same as that of the first embodiment.

In this embodiment, the interface conversion macro IFCV incorporates a late write function. The late write function is the function to write a write data, which is supplied in response to the write command WR, into the memory cell MC of the memory macro MEM at the time of supply of the next write command WR. The late write function is an internal function of the interface conversion macro IFCV. For this reason, the controller CTRL1 or CTRL2 that accesses the memory macro MEM does not recognize the late write function. However, the late write function can improve the system interface specification. Specifically, the late write function can reduce the time after receiving the write command WR until the write operation is started. In particular, in the burst write operation, the write operation can be started without waiting for the last supplied write data signal. Moreover, when the interface conversion macro IFCV generates the memory clock signal MCK and the output clock signal OUTCK that are common in both the read operation and the write operation, the read latency RL (number of clocks) can be reduced. As a result, the usage efficiency of the memory bus MBUS can be improved.

In order to achieve the late write function, a latch circuit in the burst address buffer/latch 16D has a function to hold the burst address signal bAD0-1 supplied along with the write command WR until the next write command WR is supplied. The write data hold circuit WHLD of the serial/parallel conversion circuit 34D has a function to hold the write data signal Din until the next write command WR is supplied.

The address register 30D includes a write address hold part WRA, a selector SEL, and a comparator CMP in addition to a non-illustrated register for holding the address AD. The write address hold part WRA has a function to hold the address signal AD supplied along with the write command WR until the next write command WR is supplied. The selector SEL outputs the address signal AD from the address buffer/latch 14 as the memory address signal MAD when the read command RD and the refresh command REF are supplied. The selector SEL outputs the address signal AD held in the write address hold part WRA as the memory address signal MAD when the write command WR is supplied to memory output circuit. Signals indicative of the read command RD, the write command WR, and the refresh command REF are generated by the command decoder 24D. The comparator CMP outputs a coincidence signal COIN when the address signal AD supplied along with the read command RD matches with the address signal AD held in the write address hold part WRA.

The switch circuit SW is turned on in response to the coincidence signal COIN to transfer the memory data input signals MDin0-3 to the parallel/serial conversion circuit 36D. The parallel/serial conversion circuit 36D sequentially outputs the memory data output signals MDout0-3 as the data output signal ODAT when the coincidence signal COIN is not output. The parallel/serial conversion circuit 36D sequentially outputs the memory data input signals MDin0-3 as the data output signal ODAT when the coincidence signal COIN is output.

Figure 18:
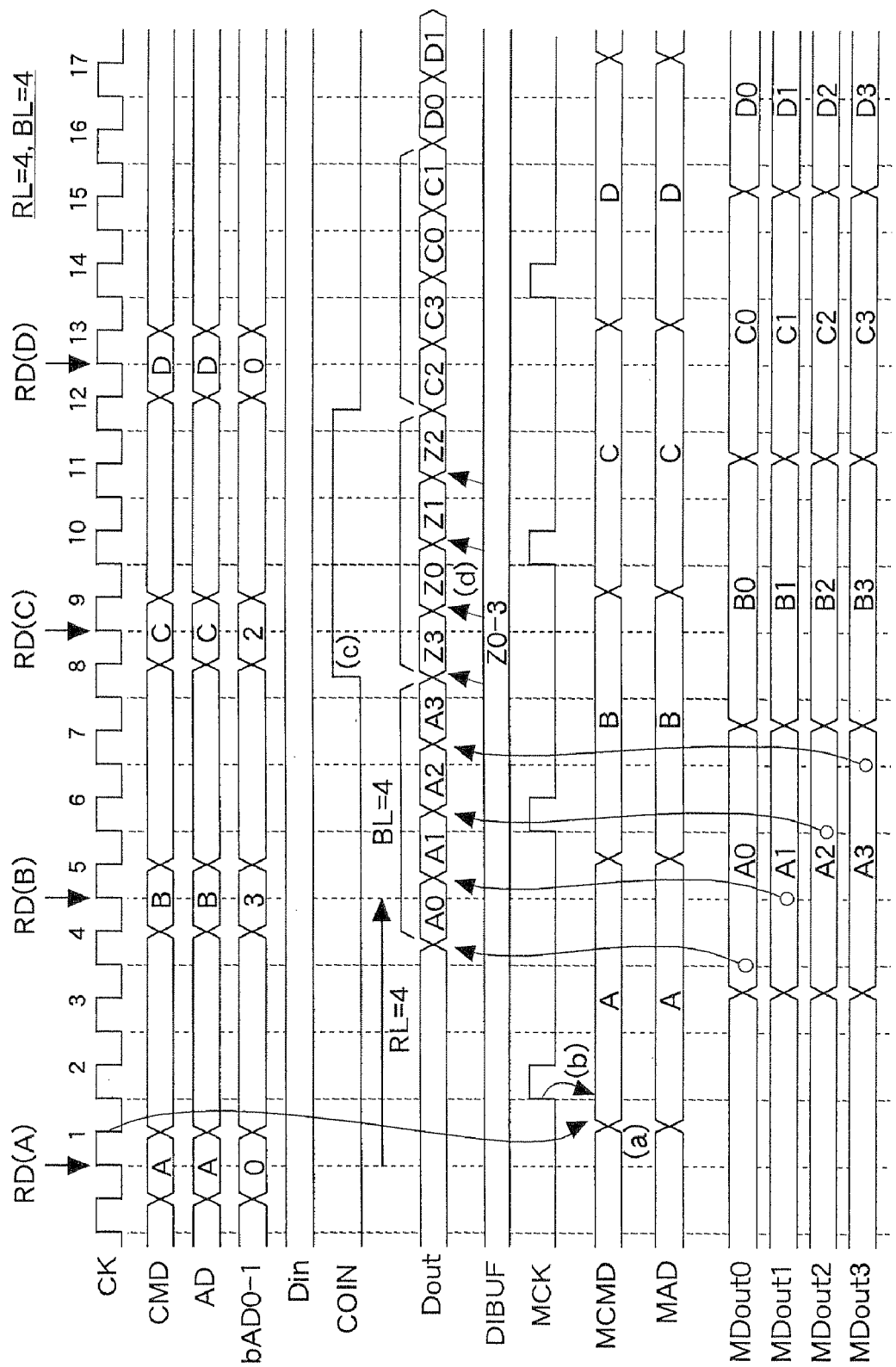
FIG. 18 illustrates a timing chart showing a read operation of the fifth embodiment.

FIG. 18 illustrates the read operation of the fifth embodiment. The detailed description of the same operation as that of the first embodiment (FIG. 7) is omitted. In this example, the output clock signal OUTCK is output in synchronization with the falling edge of the clock signal CK at which the read command RD is received. The memory command signal MCMD and the memory address signal MAD are output to the memory MEM in synchronization with the output clock signal OUTCK (FIG. 18(a)). The memory clock signal MCK is, for example, generated in synchronization with the next clock pulse CK of the clock pulse CK at which the read command RD is received (FIG. 18(b)). The operation after the memory clock MCK is output is the same as that of FIG. 7.

Figure 19:
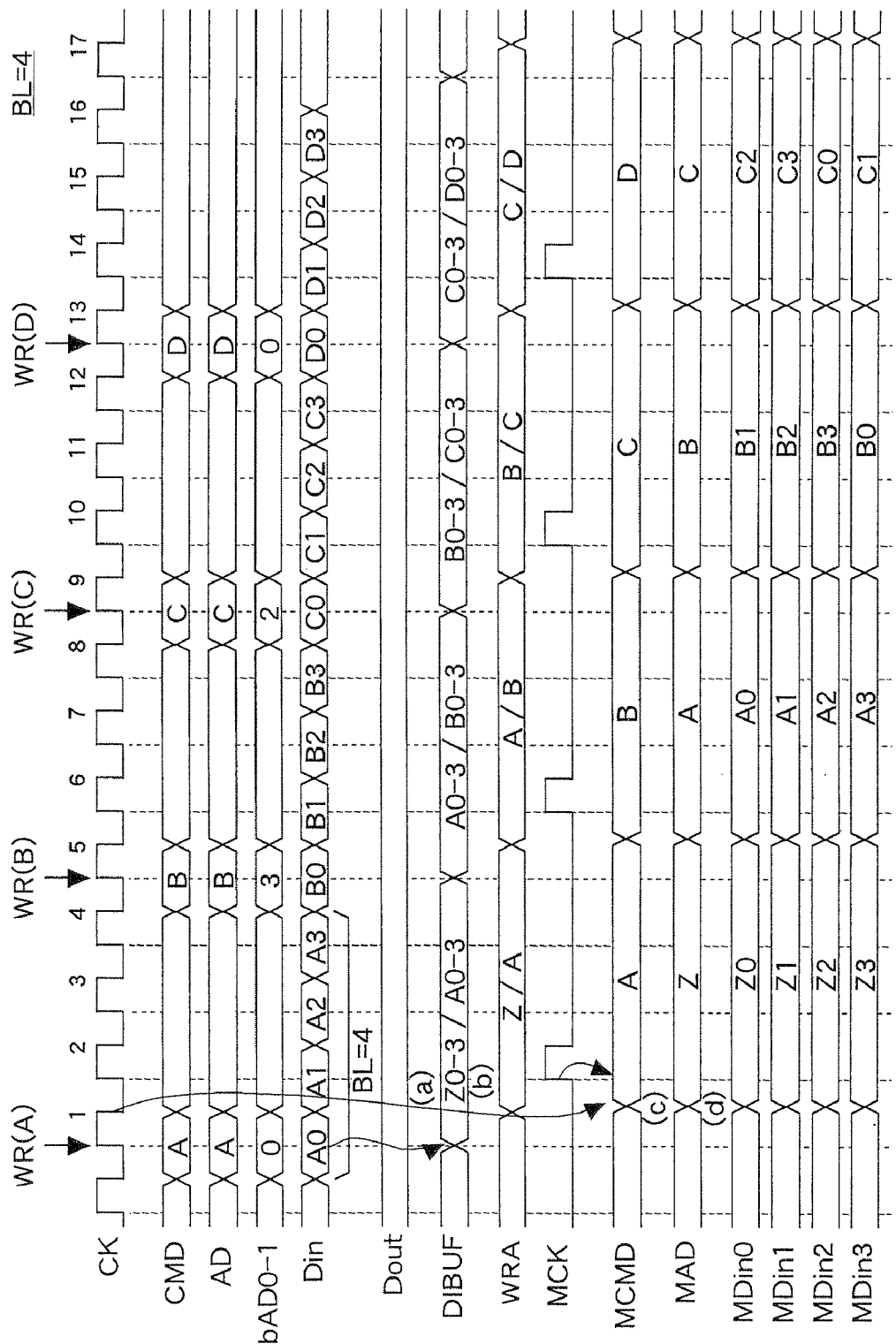
FIG. 19 illustrates a timing chart showing a write operation of the fifth embodiment.

The timing of generating the output clock signal OUTCK and memory clock signal MCK in response to the command signal CMD is the same as that of the write operation shown in FIG. 19. Thus, part of the clock control circuit 22D can be made common in both the write operation and the read operation, and the circuit size of the interface conversion macro IFCV can be reduced. In this embodiment, since the output timing of the memory clock signal MCK for outputting the command signal MCMD and the like to the memory MEM can be made earlier, the read latency RL can be set to "4".

In addition, in the late write operation, the write data signal Din that was supplied along with the immediately preceding write command WR is not written in the memory cell MC. Accordingly, when the address signal AD (B) supplied along with the read command RD is the same as the address signal AD (Z) supplied along with the immediately preceding write command WR, the coincidence signal COIN is output (FIG. 18(c)), and data signals Z0-3 held in the write data hold circuit WHLD of the serial/parallel conversion circuit 34 are output as the data output signal Dout (FIG. 18(d)).

FIG. 19 illustrates the write operation of the fifth embodiment. The detailed description of the same operation as that of the first embodiment (FIG. 8) is omitted. In this example, the write data hold circuit WHLD of the serial/parallel conversion circuit 34 holds both the write data signals (e.g., Z0-3) supplied along with the last write command WR and the write data signals (e.g., A0-3) supplied along with the current write command WR (FIG. 19(a)). The write address hold part WRA of the address register 30D holds both the address signal (e.g., Z) supplied along with the last write command WR and the address signal (e.g., A) supplied along with the current write command WR (FIG. 19(b)).

In response to the write command WR, the interface conversion macro IFCV outputs the address signal Z and write data signals Z0-3 supplied along with the last write command WR to the memory macro MEM as the memory address signal AD and memory data input signal MDin (FIG. 19(c, d)), thus executing the late write operation. In addition, the late write function is achieved by the interface conversion macro IFCV, and the memory macro MEM does not incorporate the late write function. Accordingly, even in the case where the system SYS is to mount the late write function, the common memory macro MEM without the late write function can be used.

As described above, also in the fifth embodiment, the same effect as that of the first embodiment described above can be obtained. Furthermore, in this embodiment, the read latency RL can be reduced by mounting the late write function on the interface conversion macro IFCV. Furthermore, the time after receiving the write command WR until the write operation is started can be reduced. As a result, the usage efficiency of the memory bus MBUS can be improved also in the case where the common memory macro MEM is used.

Figure 20:
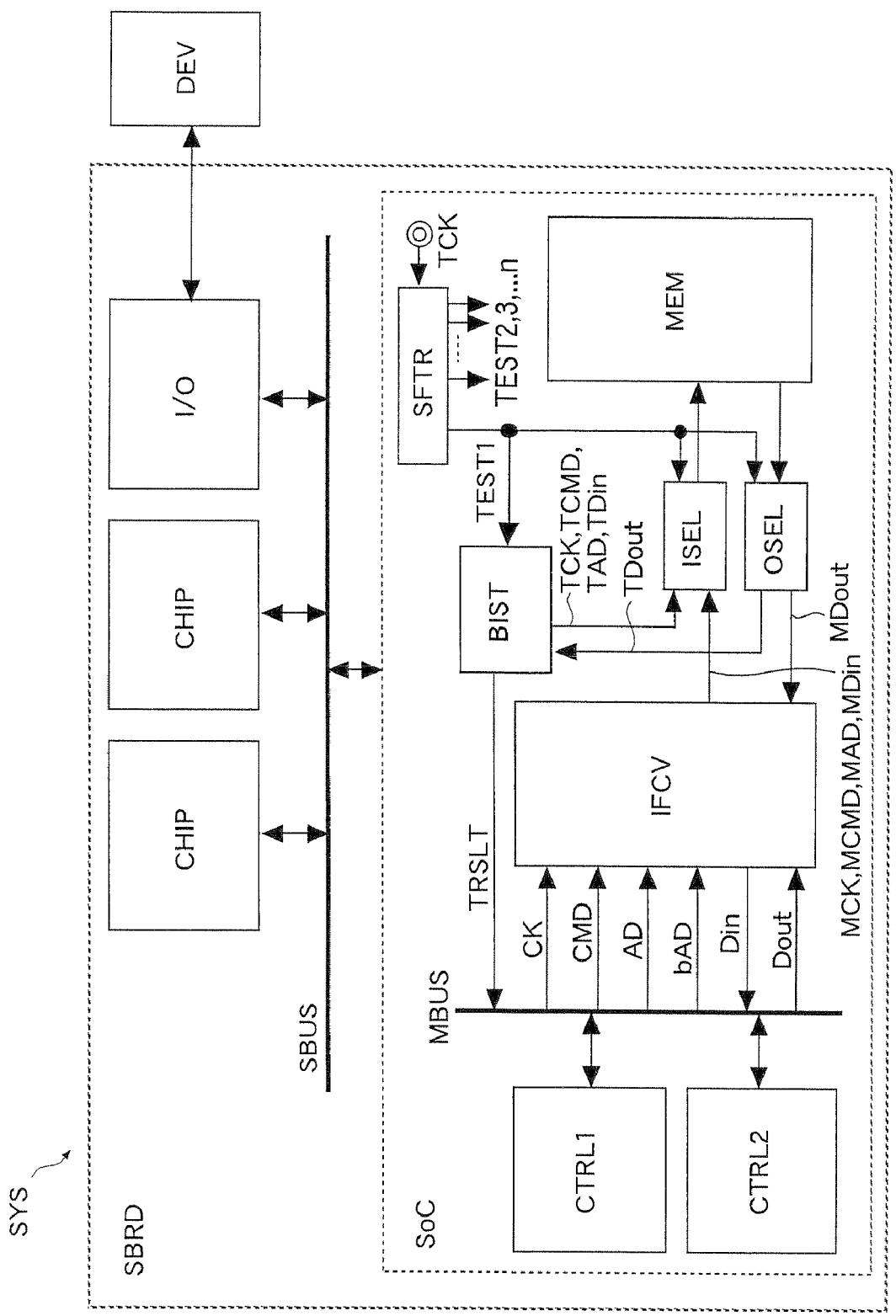
FIG. 20 illustrates a block diagram showing a sixth embodiment.

FIG. 20 illustrates a sixth embodiment. The same element as that described in the first embodiment is given the same reference numeral to omit the detailed description thereof. In this embodiment, the SoC includes a test circuit BIST for executing an operation test of the memory macro MEM, a shift register SFTR for the test, an input selection circuit ISEL, and an output selection circuit OSEL. The test circuit BIST is directly coupled to the memory macro MEM via the input selection circuit ISEL and the output selection circuit OSEL. The test circuit BIST outputs a result TRSLT of the operation test of the memory macro MEM to the memory bus MBUS. The SoC includes a test clock terminal for receiving a test clock TCK. The configuration of the SoC except those of the test circuit BIST and control circuits ISEL, OSEL, and SFTR is the same as that of the first embodiment. The configuration of the system SYS is the same as that of the first embodiment except the test function of the SoC. Namely, the systems SYS is a portable equipment, such as a mobile phone, for example.

The test circuit BIST is the so-called built-in self-test circuit, which, during a test mode, outputs a test pattern to the memory MEM and receives a data output signal read from the memory MEM as a test data output signal TDout. The test circuit BIST compares the test data output signal TDout with expected values to determine whether the memory macro MEM is good or bad, and outputs the determination result as the test result signal TRSLT. The test pattern is supplied to the memory MEM as a test clock signal CLK, a test command signal TCMD, a test address signal TAD, and a test data input signal TDin compliant with the memory interface specification.

The shift register SFTR outputs either of test signals TEST1, 2, . . . , n for carrying out test of functional blocks in the SoC in response to the number of pulses of the test clock signal CLK that is received during the test mode. When the test signal TEST1 is output, a test of the memory MEM by the test circuit BIST is carried out.

The input selection circuit ISEL outputs the signals MCK, MCMD, MAD, and MDin supplied from the interface conversion macro IFCV to the memory MEM during the normal operation mode, while during the test mode, when the test signal TEST1 is output, the input selection circuit ISEL outputs the signals TCK, TCMD, TAD, and TDin supplied from the test circuit BIST to the memory MEM. The output selection circuit OSEL outputs a data output signal supplied from the memory MEM to the interface conversion macro IFCV as the memory data output signal MDout during the normal operation mode, while during the test mode, when the test signal TEST1 is output, the output selection circuit OSEL outputs a data output signal supplied from the memory MEM to the test circuit BIST as the test data output signal TDout. Namely, the input selection circuit ISEL and the output selection circuit OSEL operate as a selector that couples the test circuit BIST to the memory macro MEM during the test mode and couples the interface conversion macro IFCV to the memory macro MEM during the normal operation mode.

In this embodiment, the result TRSLT of the operation test by the test circuit BIST is output to the outside of the SoC via an external terminal. Or, the result TRSLT of the operation test is held in at least either of the controllers CTRL1-2, and subsequently is output to the outside of the SoC. Accordingly, the operation test of the memory macro MEM can be performed after a semiconductor wafer including a plurality of SoC chips is manufactured. Or, the operation test of the memory macro MEM can be performed after the SoC is packaged.

Furthermore, in this embodiment, the common memory macro MEM is used independently of the system interface specifications of the controllers CTRL1-2. In other words, multiple types of system interface specifications for accessing the memory macro MEM are converted to the common memory interface specification for accessing the memory macro MEM by way of the interface conversion macro IFCV. Since the operating specification (interface specification) of the memory macro MEM mounted on a SoC can be made the same independently of the system SYS, the test circuit BIST can be made common independently of the system interface specification of the system SYS.

As described above, also in the sixth embodiment, the same effect as that of the first embodiment described above can be obtained. Furthermore, in this embodiment, by mounting the interface conversion macro IFCV on an SoC, the memory macro MEM independent of system specifications can be used, so that the common test circuit BIST independent of system specifications can be used. Accordingly, when designing a system SYS, the time required for test design of the memory macro MEM can be reduced. As a result, the design time and design cost of an SoC (semiconductor integrated circuit) can be reduced.

In addition, in the embodiments described above, examples applied to an SoC with a memory macro MEM of DRAM have been described. However, the embodiments may be applied to an SoC with a memory macro of pseudo SRAM, SRAM, flash memory, or ferroelectric memory, for example.

In the third embodiment described above, an example corresponding to the burst length BL=1 was described. However, for example, in the case where the controller CTRL1 or CTRL2 outputs the memory command signal MCMD shown in FIG. 3, the memory macro MEM can be directly coupled to the memory bus MBUS. In this case, in FIG. 13, for example, the read command MCMD (A) is supplied to the memory MEM in synchronization with the clock pulse CK2, and the controller CTRL1 or CTRL2 can receive the first read data signal A0 in synchronization with a clock pulse C1(5. Accordingly, the read latency RL can be set to "3".

A proposition of the embodiments is to reduce the design verification time, evaluation time, and test time of a semiconductor integrated circuit and reduce the design time and design cost of the semiconductor integrated circuit even in the case where the interface specification of a memory mounted on the semiconductor integrated circuit differs.

In an embodiment, a semiconductor integrated circuit includes a memory macro and an interface conversion macro. The memory macro includes a memory cell array, and a memory interface part that inputs and outputs signals compliant with a memory interface specification in order to access the memory cell array. The interface conversion macro converts a signal compliant with a system interface specification output from a controller to a signal compliant with the memory interface specification, and outputs the same to a memory interface part. Moreover, the interface conversion macro converts a signal that is output from the memory interface part to a signal compliant with the system interface specification, and outputs the same to the controller. By converting the system interface specification and the memory interface specification to each other by the interface conversion macro IFCV, one type of memory macro can be used in common in various systems even when the system interface specification differs. Accordingly, when designing a system, the design verification time and evaluation time of the memory macro can be reduced. In other words, the design verification time and evaluation time of the semiconductor integrated circuit can be reduced. As a result, the design time and design cost of the semiconductor integrated circuit can be reduced.

For example, the semiconductor integrated circuit includes a controller in addition to the memory macro and the interface conversion macro. The interface conversion macro is manufactured along with the controller by coupling between terminals of logic elements that are formed in an array configuration in advance. Then, the test of the interface conversion macro is carried out along with the test of the controller. For example, the memory macro is designed as a hard macro cell. By designing, as a hard macro cell, the memory macro that is independent of system specifications and can be used in common, the size of the memory macro can be minimized and the chip cost of the semiconductor integrated circuit can be reduced. For example, the interface conversion macro is designed as a soft macro. This allows the interface conversion macro to be designed in such shape and with such terminal position that conform to free spaces of newly designed various semiconductor integrated circuits. Accordingly, the design efficiency of a semiconductor integrated circuit can be improved and the design time and design cost of the semiconductor integrated circuit can be reduced.

In another preferred embodiment, the interface conversion macro includes a command decoder, a clock control circuit, a latch, a write data conversion circuit, and a read data conversion circuit. The command decoder decodes a command signal that is output from the controller. The clock control circuit generates clock pulses compliant with the memory interface specification in response to a decoded result of the command decoder. The latch holds a write data signal that is output from the controller. The write data conversion circuit outputs the write data signal held in the latch to the memory macro in synchronization with the clock pulse. The read data conversion circuit outputs a read data signal that is output from the memory macro, to the controller in synchronization with the clock pulse.

For example, the system interface specification includes a burst length. The burst length is the number of times of the read data signal that is output in response to a single read command, or the number of times of the write data signal that is input in response to a single write command. The clock control circuit generates a number of clock pulses corresponding to the burst length. Or, the system interface specification includes a read latency. The read latency is the number of clocks after the read command is supplied until a read data is output. The clock control circuit generates a clock pulse after a number of clocks corresponding to the read latency. Accordingly, the data signal interfaces can be converted to each other by the interface conversion macro and thus the memory macro can be accessed without malfunctioning.

In another preferred embodiment, the number of bits of the write data signal that is output from the interface conversion macro to the memory macro is an integer multiple of the number of bits of the write data signal that is output from the controller to the interface conversion macro. A write data hold circuit of the write data conversion circuit holds a serial write data signal, which is output from the controller, in synchronization with a clock pulse and outputs the held write data signal to the memory macro as a parallel write data signal after a clock pulse is output.

For example, the write data hold circuit includes a plurality of hold parts corresponding to the number of bits of the write data signal that is output to the memory macro. A data clock generation circuit of the interface conversion macro sequentially generates data input clock signals corresponding to the hold parts, respectively, in response to a burst address signal, and outputs the generated data input clock signals to the write data conversion circuit as clock pulses. Here, the burst address signal indicates in which of the hold parts the serial write data signals are to be held.

For example, the number of the serial write data signals that are output from the controller in response to a command signal is fewer than the number of the hold parts. The data clock generation circuit selects at least either of the hold parts in response to a data selection address, and sequentially generates a data input clock signal corresponding to the selected hold part. Moreover, the data clock generation circuit outputs the generated data input clock signal to the write data conversion circuit as a clock pulse, and at the same time, outputs a data mask signal corresponding to a non-selected hold part to the memory macro. Here, the data selection address indicates the hold part for holding the serial write data signal. The memory macro masks the writing of a write data signal corresponding to the data mask signal into the memory cell.

Accordingly, also when the number of bits of the write data signal used in the controller is fewer than the number of bits of the write data signal supplied to the memory macro, the write operation of the memory macro can be executed by the interface conversion macro successfully. In this case, the serial write data signal can be output to any write data signal line of the memory macro in response to the burst address signal. Or, in response to the data selection address, only necessary write data signal can be written to the memory macro and the writing of the other write data signals into the memory macro can be masked. Namely, the memory macro can be accessed without malfunctioning.

In another preferred embodiment, the number of bits of the read data signal that is output from the memory macro to the interface conversion macro is an integer multiple of the number of bits of the read data signal that is output from the interface conversion macro to the controller. The read data conversion circuit converts a parallel read data signal that is output from the memory macro to a serial read data signal in synchronization with a clock pulse, and outputs the converted read data signal to the controller.

For example, the data clock generation circuit of the interface conversion macro sequentially generates data output clock signals in response to a burst address signal, and outputs the generated data output clock signals to the read data conversion circuit as clock pulses. Here, the burst address signal indicates the output order of the parallel read data signals to the controller.

For example, the number of serial read data signals that are output from the interface conversion macro to the controller in response to a command signal is fewer than the number of parallel read data signals output from the memory macro. The data clock generation circuit selects the read data signal, which the controller requires, among the parallel read data signals in response to the data selection address signal, and sequentially generates data output clock signals corresponding to the selected read data signal. Moreover, the data clock generation circuit reads the generated data output clock signals as clock pulses, and outputs the same to the read data conversion circuit.

Accordingly, also when the number of bits of the read data signal used in the controller is fewer than the number of bits of the read data signals output from the memory macro, the read operation of the memory macro can be executed by the interface conversion macro makes successfully. In this case, the parallel read data signals output from the memory macro can be output to the controller in any order in response to the burst address signal. Or, only arbitrary read data signal among the parallel read data signals output from the memory macro can be read in response to the data selection address. Namely, the memory macro can be accessed without malfunctioning.

In another preferred embodiment, the command conversion circuit of the interface conversion macro converts a command signal compliant with the system interface specification output from the controller to a command signal compliant with the memory interface specification, and outputs the converted command signal to the memory macro. The command signal interfaces can be converted to each other by the interface conversion macro and thus the memory macro can be accessed without malfunctioning.

In another preferred embodiment, the semiconductor integrated circuit includes a test circuit for testing a memory macro, and a selector. The test circuit outputs a test signal compliant with the memory interface specification to the memory macro in order to access the memory macro, and compares a test read data signal that is output from the memory macro in response to the test signal with expected values and thereby determines whether the memory macro is good or bad. The selector couples the test circuit to the memory macro during a test mode, and couples the interface conversion macro to the memory macro during the normal operation mode. The memory macro is independent of system specifications and used in common. Thus, the test circuit is also independent of system specifications and can be used in common. Accordingly, when designing a system, the time required for the test design of the memory macro can be reduced. As a result, the design time and design cost of the semiconductor integrated circuit can be reduced.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor integrated circuit, comprising:
 a memory macro including a memory cell array and a memory interface portion that inputs and outputs a signal compliant with a memory interface specification; and
 an interface conversion macro which converts a signal compliant with a system interface specification output from a controller to a signal compliant with the memory interface specification and outputs to the memory interface portion, and which converts a signal output from the memory interface portion to a signal compliant with the system interface specification and outputs to the controller.

2. The semiconductor integrated circuit according to claim 1, wherein
 the interface conversion macro includes:
 a command decoder that decodes a command signal output from the controller;
 a clock control circuit that generates a clock pulse compliant with the memory interface specification according to a decoded result of the command decoder;
 a latch that holds a write data signal output from the controller;
 a write data conversion circuit that holds the write data signal held in the latch in synchronization with the clock pulse, and outputs the held write data signal to the memory macro; and
 a read data conversion circuit that outputs a read data signal output from the memory macro to the controller in synchronization with the clock pulse.

3. The semiconductor integrated circuit according to claim 2, wherein
 the command signal includes at least one of a read command and a write command,
 the system interface specification includes a burst length indicative of the number of times of a read data signal that is output in response to a single read command or the number of times of a write data signal that is input in response to a single write command, and
 the clock control circuit generates a number of clock pulses corresponding to the burst length.

4. The semiconductor integrated circuit according to claim 2, wherein the command signal includes a read command, the system interface specification includes a read latency indicative of the number of clocks after the read command is supplied until a read data is output, and the clock control circuit generates, when a decoded result of the command decoder indicates a read command, a clock pulse after a number of clocks corresponding to the read latency.

5. The semiconductor integrated circuit according to claim 2, wherein the number of bits of a write data signal that is output from the interface conversion macro to the memory macro is an integer multiple of the number of bits of a write data signal that is output from the controller to the interface conversion macro, and the write data conversion circuit includes a write data hold circuit, which holds a serial write data signal in synchronization with the clock pulse, the serial write data signal being output from the controller, and which, after the clock pulse is output, outputs the held write data signal to the memory macro as a parallel write data signal.

6. The semiconductor integrated circuit according to claim 5, wherein the interface conversion macro includes a data clock generation circuit that receives the clock pulse, the interface conversion macro being arranged between the clock control circuit and the write data conversion circuit, the write data hold circuit includes a plurality of hold portions corresponding to the number of bits of a write data signal that is output to the memory macro, and the data clock generation circuit sequentially generates data input clock signals corresponding to the hold parts, respectively, in response to a burst address signal indicating in which of the hold portions a serial write data signal is to be held, and outputs the generated data input clock signals to the write data conversion circuit as the clock pulses.

7. The semiconductor integrated circuit according to claim 6, wherein the number of serial write data signals that are output from the controller corresponding to the command signal is fewer than the number of the hold portions, and the data clock generation circuit selects at least one of the hold portions according to a data selection address indicative of the hold portion that holds the serial write data signal, sequentially generates data input clock signals corresponding to the selected hold part according to the burst address signal, outputs the generated data input clock signal to the write data conversion circuit as the clock pulse, and outputs a data mask signal corresponding to a non-selected hold part to the memory macro, and wherein the memory macro masks the writing of a write data signal corresponding to the data mask signal into a memory cell.

8. The semiconductor integrated circuit according to claim 5, wherein the interface conversion macro includes a data clock generation circuit that receives the clock pulse, the interface conversion macro being arranged between the clock control circuit and the write data conversion circuit, the write data hold circuit includes a plurality of hold portions corresponding to the number of bits of a write data signal that is output to the memory macro, the number of serial write data signals that are output from the controller corresponding to the command signal is fewer than the number of the hold parts, the data clock generation circuit selects at least one of the hold parts according to a data selection address indicative of a hold part that holds the serial write data signal, and generates a data input clock signal corresponding to the selected hold portion, outputs the generated data input clock signal to the write data conversion circuit as the clock pulse, outputs a data mask signal corresponding to a non-selected hold portion to the memory macro, and the memory macro masks the writing of a write data signal corresponding to the data mask signal into a memory cell.

9. The semiconductor integrated circuit according to claim 2, wherein the number of bits of a read data signal that is output from the memory macro to the interface conversion macro is an integer multiple of the number of bits of a read data signal that is output from the interface conversion macro to the controller, and the read data conversion circuit converts a parallel read data signal that is output from the memory macro to a serial read data signal in synchronization with a clock pulse, and outputs the converted read data signal to the controller.

10. The semiconductor integrated circuit according to claim 9, wherein the interface conversion macro includes a data clock generation circuit that receives the clock pulse, the interface conversion macro being arranged between the clock control circuit and the read data conversion circuit, and the data clock generation circuit sequentially generates data output clock signals according to a burst address signal indicative of an output order of a parallel read data signal to the controller, and outputs the generated data output clock signal to the read data conversion circuit as the clock pulses.

11. The semiconductor integrated circuit according to claim 10, wherein the number of the serial read data signals that are output from the interface conversion macro to the controller in response to a command signal is fewer than the number of parallel read data signals output from the memory macro, and the data clock generation circuit selects the read data signal, which the controller requires, among the parallel read data signals according to the data selection address signal, and sequentially generates the data output clock signals corresponding to the selected read data signal according to the burst address signal, and outputs the generated data output clock signal to the read data conversion circuit as the clock pulse.

12. The semiconductor integrated circuit according to claim 9, wherein the interface conversion macro includes a data clock generation circuit that receives the clock pulse, the interface conversion macro being arranged between the clock control circuit and the read data conversion circuit, wherein the number of the serial read data signals that are output from the interface conversion macro to the controller in response to a command signal is fewer than the number of parallel read data signals output from the memory macro, and the data clock generation circuit selects the read data signal, which the controller requires, among the parallel read data signals according to the data selection address signal, and generates the data output clock signal corresponding to the selected read data signal according to the burst address signal, and outputs the generated data output clock signal to the read data conversion circuit as the clock pulse.

13. The semiconductor integrated circuit according to claim 1, wherein
the interface conversion macro includes a command conversion circuit that converts a command signal compliant with the system interface specification output from the controller to a command signal compliant with the memory interface specification and outputs the converted command signal to the memory macro.

14. The semiconductor integrated circuit according to claim 1, wherein
the interface conversion macro includes:
a hold circuit that holds an address signal and a write data signal that are supplied in response to a write command until the next write command is supplied; and
a memory output circuit that outputs the address signal and the write data signal held in the hold circuit to the memory macro in response to the next write command.

15. The semiconductor integrated circuit according to claim 14, wherein
the interface conversion macro includes a read output circuit, which outputs the write data signal held in the hold circuit as a read data signal when the address signal supplied corresponding to a read command matches with the address signal held in the hold circuit.

16. The semiconductor integrated circuit according to claim 1, further comprising:
a test circuit which outputs a test signal compliant with the memory interface specification to the memory macro in order to access the memory macro, and compares a test read data signal, which is output from the memory macro in response to the test signal, with an expected value and thereby determines whether the memory macro is good or bad; and
a selector that couples the test circuit to the memory macro during a test mode and couples the interface conversion macro to the memory macro during a normal operation mode.

17. The semiconductor integrated circuit according to claim 1, further comprising the controller, wherein
the interface conversion macro is manufactured along with the controller by coupling between terminals of logic elements that are formed in an array configuration in advance, and
a test of the interface conversion macro is performed along with a test of the controller.

18. The semiconductor integrated circuit according to claim 17, wherein
the memory macro is designed as a hard macro, and the interface conversion macro is designed as a soft macro.

* * * * *